US005252778A

United States Patent [19]

Ogawa

[11] Patent Number: 5,252,778

[45] Date of Patent: Oct. 12, 1993

[54] GAS-INSULATED ELECTRIC APPARATUS

[75] Inventor: Naoya Ogawa, Yokohama, Japan

[73] Assignee: Kabushiki Kaisha Toshiba, Kawasaki, Japan

[21] Appl. No.: 838,928

[22] Filed: Feb. 21, 1992

[30] Foreign Application Priority Data

Feb. 22, 1991 [JP] Japan .................................... 3-50813
Sep. 10, 1991 [JP] Japan .................................. 3-230198

[51] Int. Cl.$^5$ ........................ H05K 7/20; H01F 27/08; F28D 15/00

[52] U.S. Cl. .............................. 174/16.1; 165/104.33; 165/153; 165/175; 174/15.1

[58] Field of Search ............................ 174/15.1, 16.1; 165/104.33, 175, 153

[56] References Cited

U.S. PATENT DOCUMENTS

| | | | |
|---|---|---|---|
| 2,554,185 | 5/1951 | Giegerich | 165/104.33 X |
| 2,845,472 | 7/1958 | Narbut | 174/15.1 |
| 3,016,230 | 1/1962 | Cederstrom et al. | 165/148 |
| 3,452,147 | 6/1969 | Narbut et al. | 174/15.1 |
| 3,610,327 | 10/1971 | Rutherford | 165/104.33 X |
| 3,834,171 | 9/1974 | Johanson | 165/104.33 X |
| 4,140,174 | 2/1979 | Lingenfelter et al. | 165/104.33 |
| 4,437,082 | 3/1984 | Walsh et al. | 174/15.1 |

FOREIGN PATENT DOCUMENTS

| | | |
|---|---|---|
| 0040262 | 11/1981 | European Pat. Off. . |
| 0082360 | 6/1983 | European Pat. Off. . |
| 2237289 | 2/1975 | France . |
| 2137329 | 10/1984 | United Kingdom . |

OTHER PUBLICATIONS

Bulletin Technique De La Suisse Romande, vol. 83, No. 9, Apr. 27, 1957, pp. 123–130, A. Gardel, "Pressure Drop In Flows Through T-Shaped Pipe Fittings".

Bulletin Technique De La Suisse Romande, vol. 83, No. 10, May 11, 1957, pp. 143–149, A. Gardel, "Pressure Drop In Flows Through T-Shaped Pipe Fittings".

*Primary Examiner*—Morris H. Nimmo

*Attorney, Agent, or Firm*—Oblon, Spivak, McClelland, Maier & Neustadt

[57] ABSTRACT

A gas-insulated transformer comprises a transformer body and a radiator both filled with $SF_6$ gas. The radiator comprises a gas introducing header, a gas discharging header, a plurality of radiation panels, and couplers for coupling the gas introducing header, gas discharging header and radiation panels. The coupler has a passageway having a cross section area gradually increasing from an end portion of the radiation panel towards the header.

22 Claims, 24 Drawing Sheets

FIG. 10A
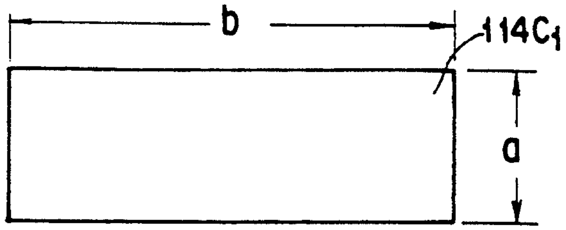
FIG. 10B
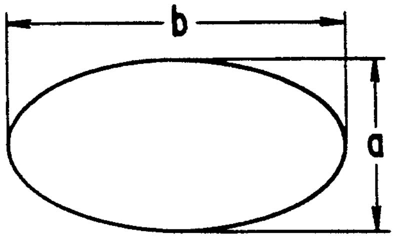
FIG. 11
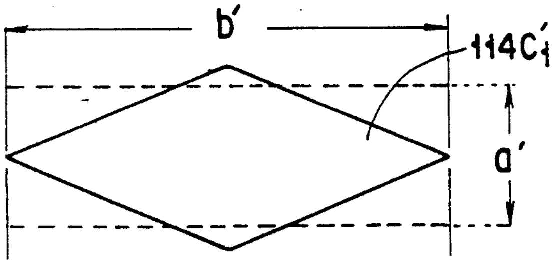
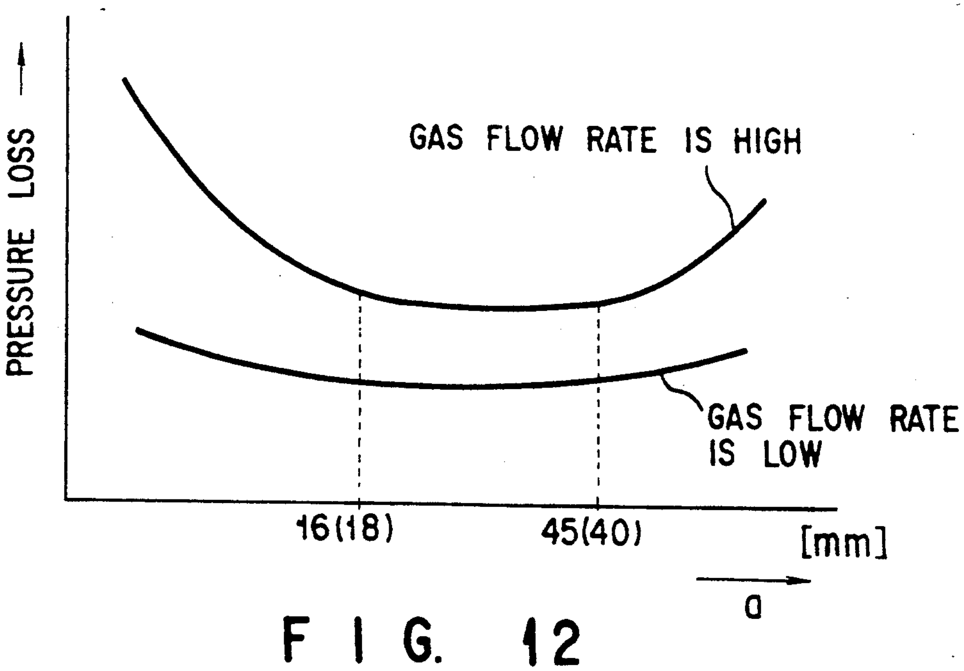
FIG. 12

GAS-INSULATED ELECTRIC APPARATUS

BACKGROUND OF THE INVENTION

1. Field of the Invention

The present invention relates generally to a gas-insulated electric apparatus, e.g. a gas-insulated transformer using a high withstand voltage insulating gas such as $SF_6$, and more particularly to a gas-insulated electric apparatus having a radiator for cooling the high withstand voltage insulating gas.

2. Description of the Related Art

Recently, a transformer station is often constructed within an office building or in a basement. In the transformer station, a high voltage electric apparatus such as a power transformer is installed. In a conventional high voltage electric apparatus, an insulating oil has been used as a cooling medium. The insulating oil has a problem of safety, e.g. fire. Under the situation, in these years, $SF_6$ gas has been used in a high voltage electric apparatus. The $SF_6$ gas has been used not only as a high withstand voltage insulating gas but also as a cooling medium. Such a gas-insulated electric apparatus comprises an electric apparatus body and a radiator attached to the body.

As is well known, however, the specific heat and conduction of $SF_6$ gas is lower than that of the insulating oil. Since the heat transmission performance is much inferior to that of the insulating oil, it is necessary to use a large-capacity radiator. In addition, the space in the office building or basement, where the high voltage electric apparatus is to be installed, is limited; thus, it is difficult to install the high voltage electric apparatus with a large radiator.

FIG. 1 shows an example of a conventional self-cooling type gas-insulated transformer, which is a typical example of the above gas-insulated electric apparatus. In FIG. 1, the self-cooling type gas-insulated transformer 10 comprises a transformer body 12 and a radiator 14. Main components of the transformer body 12 are a casing 12A, a coil 12B and an iron core 12C. The coil 12B and iron core 12C are situated within the casing 12A in the insulated state. A high withstand voltage insulating gas or $SF_6$ 16 is filled in the transformer body 12 and radiator 14.

The radiator 14 will now be described in detail with reference to FIGS. 2 and 3. A plurality of mutually distanced panels 14B, each having substantially the same thickness, are coupled between an upper header 14A and a lower header 14A, which have an oval cross section, via couplers 14C. The couplers 14C are provided at both end portions of each panel 14B. The couplers 14C, on the other hand, are attached to the mutually facing surfaces of the upper and lower headers 14A. The couplers 14C control branching and confluence of insulating gas 16 which flows through the panels 14B.

An open end portion of each of the upper and lower headers 14A is provided with a flange 14D1, 14D2. The flanges 14D1 and 14D2 are connected to a transformer body (not shown). Thereby, the inside space of the transformer body communicates with the inside space of the upper header 14A and the inside space of the lower header 14A. The other end portions of the upper and lower headers 14A are closed Each panel 14B has a longitudinally extending inside space. The inside space of each panel 14B communicates with the inside space of the upper header 14A and the inside space of the lower header 14A. Accordingly, a closed gas passageway is formed by the mutually communicating inside spaces of the transformer body, upper and lower headers 14A and panels 14B.

The $SF_6$ gas 16 filled in the closed gas passageway circulates naturally through the closed passageway, and radiates heat in the panels 14B principally, thereby cooling the inside spaces of the transformer body and radiator 14. The natural circulation of $SF_6$ gas 16 will now be described more specifically. The $SF_6$ gas 16 flows to a passageway 18A1 of the upper header 14A from the transformer body. Then, the gas 16 is branched into the panels 14B, flowing vertically downwards through passageways 18B of the panels 14B. The $SF_6$ gas 16 flowing through the passageways 18B of panels 14B is made confluent in a passageway 18A2 of the lower header 14A. The confluent $SF_6$ gas 16 returns to the transformer body.

In the above, when the $SF_6$ gas flows through the passageways 18B of the panels 14B, the air around the panels 14B is heated and convection occurs By the convection, heat radiation is principally caused. When the gas 16 flows in the passageways 18B of panels 14 in turbulent flows, radiation efficiency is increased.

In this case, since $SF_6$ gas having less heat transfer performance is substituted for the insulating coil as a cooling medium, it is necessary to increase the circulation amount of $SF_6$ gas, thereby to enhance the cooling performance of the radiator 14.

If the ratio of the cross section area of the passageway 18A1, 18A2 of each of the upper and lower headers 14A to the cross section area of each coupler 14C between each panel 14B and upper and lower headers 14A, at which $SF_6$ gas is branched or made confluent, is large, the branch loss coefficient and confluence loss coefficient are high. In this case, the following disadvantage arises, and the size of the radiator 14 cannot be reduced.

First, the branch loss/confluence loss at the coupler 14C is expressed by the product of the square of the flow velocity of $SF_6$ gas at the passageways 18A1 and 18A2, the density of $SF_6$ gas and the branch loss coefficient or confluence loss coefficient; thus, if the branch loss coefficient or confluence loss coefficient increases, the branch loss or confluence loss increases or the circulation flow rate of $SF_6$ gas decreases.

Secondly, if the branch loss or confluence loss increases, the flow rates of $SF_6$ flowing through the panels 14B tend to become non-uniform, and a laminar flow of $SF_6$ gas with low heat conductivity may occur in some of the panels 14B. In such a case, even if the number of panels 14B is increased, the radiation amount does not substantially increase.

A second example of prior art will now be described with reference to FIGS. 4 and 5. As is shown in FIGS. 4 and 5, a radiator 20 is connected to a transformer body of a self-cooling type gas-insulated transformer (not shown). The radiator 20 has a pipe-like upper header 20A, a pipe-like lower header 20A, and a plurality of mutually distanced panels 20B situated between the upper and lower headers 20A. Each panel 20B has substantially the same thickness. Each of the upper and lower headers 20A has a plurality of ducts 20C along its longitudinal direction. A hole is formed at both end portions of each panel 20B. The upper and lower headers 20A are inserted through the holes formed at both end portions of the panels 20B. The positions of the holes at both end portions of the panels 20B are made to agree with the positions of the ducts 20C of the upper and lower headers 20A, and the panels 20B are coupled to the upper and lower headers 20A by means of welding, etc. The ducts 20C of the upper header 20A are opposed to the ducts 20C of the lower header 20A. The ducts 20C of the upper and lower headers 20A control the branching and confluence of the insulating gas 16 flowing through the panels 20B.

An open end portion of each of the upper and lower headers 20A is provided with a flange 20D1, 20D2. The flanges 20D1 and 20D2 are connected to the transformer body (not shown). Thereby, the inside space of the transformer body communicates with the inside spaces of the upper and lower headers 20A. The other end portion of each of the upper and lower headers 20A is closed. Each panel 20B has a longitudinally extending inside space. The inside spaces of the panels 20B communicate with the inside spaces of the upper and lower headers 20A. Accordingly, a closed gas passageway is formed by the mutually communicating inside spaces of the transformer body, upper and lower headers 20A and panels 20B.

The $SF_6$ gas filled in the closed gas passageway circulates naturally through the closed passageway, and radiates heat in the panels 20B principally, thereby cooling the inside spaces of the transformer body and radiator 20. The natural circulation of $SF_6$ gas will now be described more specifically. The $SF_6$ gas flows to a passageway 22A1 of the upper header 20A from the transformer body. Then, the gas is branched into the panels 20B, flowing vertically downwards through passageways 22B of the panels 20B. The $SF_6$ gas flowing through the passageways 22B of panels 20B is made confluent in a passageway 22A2 of the lower header 20A. The confluent $SF_6$ gas returns to the transformer body.

In the above, when the $SF_6$ gas flows through the passageways 22B of the panels 20B, the air around the panels 20B is heated and convection occurs. By the convection, heat radiation is principally caused. When the gas flows in the passageways 22B of panels 20B in turbulent flows, radiation efficiency is increased.

In this case, since $SF_6$ gas having less heat transmission performance is substituted for the insulating coil as a cooling medium, it is necessary to increase the circulation amount of $SF_6$ gas, thereby to enhance the cooling performance of the radiator 20.

It was thought that, in order to smooth convection of air around the panels 20B and enhance the heat exchange performance of the panels 20B, the outside diameter of each of the upper and lower headers 20A, which obstruct convection, is reduced. However, if the outside diameter of each of the upper and lower headers 20A is decreased, the inside diameter thereof is also decreased and the cross section area of the passageway 22A of each header 20A is decreased. Thus, it is disadvantageous, as in the first example, to decrease the outside diameter of each of the upper and lower headers 20A, and it is difficult to decrease the size of the radiator 20.

On the other hand, the self-cooling type gas-insulated transformer of the second example, which uses the cooling medium such as insulating oil or insulating gas, is widely employed in medium- and small-capacity transformers. In the case of the self-cooling type transformer, however, the circulation force of the cooling medium for cooling the coil and iron core is weaker than that of a forced-circulation type apparatus; thus, it is necessary to reduce the pressure loss as low as possible, increase the circulation amount of cooling medium as much as possible, and let the cooling medium flow through the passageway for cooling the coil and iron core with a highest possible efficiency. If the circulation amount of cooling medium is small and the circulation efficiency of cooling medium caused to flow through the passageway for cooling the coil and iron core is low, the size, cost and installation space of the transformer must be increased.

As is shown in FIG. 1, the $SF_6$ within the transformer body flows, as indicated by broken-line arrows, through not only the passageway provided in the coil 12B and iron core 12C but also the space between the coil 12B and casing 12A, thereby to cool the coil 12B and iron core 12C. The flow of $SF_6$ gas 16 through the space between the coil 12B and casing 12A, however, does little contribute to cooling the coil 12B.

Next, a problem arising when $SF_6$ gas 16 flows through the space between the coil 12B and 12A will now be described. Suppose that the flow rate of the $SF_6$ gas flowing through the passageway for cooling the coil 12B and iron core 12C is W1, and the flow rate of the $SF_6$ gas flowing through the space between the coil 12B and casing 12A is W2. In this case, $SF_6$ gas 16 of W1 and W2 flows in the radiator 14. In order to prevent an increase in pressure loss in the radiator 14, it is necessary to increase the size of the radiator 14, which will be situated in a larger installation space, thereby preventing a decrease in circulation flow amount. Further, in order to increase W1, it is necessary to increase the cross section area of the passageway for cooling the coil 12B and iron core 12C.

As stated above, in the conventional transformer 10, the $SF_6$ 16 flows through the space between the coil 12B and casing 12A; consequently, the installation space for installing the radiator 14 and the space between the coil 12B and iron core 12C increase, resulting in an increase in size and cost of the transformer 10.

SUMMARY OF THE INVENTION

An object of the present invention is to provide a gas-insulated electric apparatus having a size reduced without degrading a cooling performance.

Another object of the invention is to provide a self-cooling type gas insulated electric apparatus having a size reduced without degrading a cooling performance.

The above objects are achieved by a gas-insulated electric apparatus comprising:

an electric apparatus body including
- a storing space,
- an electric element to be insulated, the electric element housed in the storing space, and
- a high withstand voltage insulating gas filled in the storing space; and a radiator for cooling the high withstand voltage insulating gas, including
- at least one gas introducing header connected to the electric apparatus body, for introducing the high withstand voltage insulating gas from the electric apparatus body, the gas introducing header having a plurality of ducts arranged along the longitudinal axis of the gas introducing header,
- at least one gas discharging header connected to the electric apparatus body for discharging the high withstand voltage insulating gas to the electric apparatus body, the gas introducing header having a plurality of ducts arranged along the longitudinal axis of the gas discharging header, at least one gas radiation member having a panel shape, having one open end portion directly or indirectly connected to the gas introducing header, having the other open end portion directly or indirectly connected to the gas discharging header, and having a gas passageway having a predetermined passageway cross section area along the longitudinal axis of the gas radiation member, the gas radiation member receiving the high withstand voltage insulating gas from the gas introducing header, cooling the received high withstand voltage insulating gas by radiation, and discharging the cooled high withstand voltage insulating gas to the gas discharging header, and at least one coupler interposed in at least one of a connecting portion between an end portion of the gas radiation member and the gas introducing header and a connecting portion between an end portion of the gas radiation member and the gas discharging header, said coupler passing the high withstand voltage insulating gas through, said coupler having a passageway with a shape of cross section area gradually varying from the end portion of the gas radiation member towards the connecting portion, said passageway with a thickness gradually increasing from the end portion of the gas radiation member towards the connecting portion.

The objects are also achieved by a gas-insulated electric apparatus comprising:

an electric apparatus body including a storing space, an electric element to be insulated, the electric element housed in the storing space, and a high withstand voltage insulating gas filled in the storing space; and a radiator for cooling the high withstand voltage insulating gas, including at least one gas introducing header connected to the electric apparatus body, for introducing the high withstand voltage insulating gas from the electric apparatus body, the gas introducing header having a plurality of ducts arranged along the longitudinal axis of the gas introducing header, at least one gas discharging header connected to the electric apparatus body, for discharging the high withstand voltage insulating gas to the electric apparatus body, the gas introducing header having a plurality of ducts arranged along the longitudinal axis of the gas discharging header, at least one gas radiation member having a panel shape, having one open end portion directly or indirectly connected to the gas introducing header, having the other open end portion directly or indirectly connected to the gas discharging header, and having a gas passageway having a predetermined passageway cross section area along the longitudinal axis of the gas radiation member, the gas radiation member receiving the high withstand voltage insulating gas from the gas introducing header, cooling the received high withstand voltage insulating gas by radiation, and discharging the cooled high withstand voltage insulating gas to the gas discharging header, and varying means arranged in at least one of the gas introducing header and the gas discharging header, for varying the passageway cross section area in at least one of the gas introducing header and the gas discharging header.

The objects are also achieved by a gas-insulated electric apparatus comprising:

an electric apparatus body including a storing space, an electric element to be insulated, the electric element housed in the storing space, and a high withstand voltage insulating gas filled in the storing space; and a radiator for cooling the high withstand voltage insulating gas, including at least one gas radiation member having a panel shape, having a gas passageway having a predetermined passageway cross section area along the longitudinal axis of the gas radiation member, at least one gas introducing header connected to the electric apparatus body, for introducing the high withstand voltage insulating gas from the electric apparatus body, the gas introducing header having a predetermined passageway cross section, being inserted in the vicinity of one longitudinal end portion of the gas radiation member, and having a duct at a portion crossing the gas radiation member, at least one gas discharging header connected to the electric apparatus body, for discharging the high withstand voltage insulating gas to the electric apparatus body, the gas discharging cylinder having a predetermined passageway cross section area, being inserted in the vicinity of one longitudinal end portion of the gas radiation member, and having a duct at a portion crossing the gas radiation member, wherein the improvement is that at least one of the transverse dimension of the gas introducing header and the transverse dimension of the gas discharging header is equal to or lower than the value obtained by multiplying the transverse dimension of the gas radiation member by 0.36, and the passageway cross section area in at least one of the gas introducing header and the gas discharged header is equal to or greater than the area of a circle having a diameter equal to a value obtained by multiplying the transverse dimension of the gas radiation member by 0.25.

The objects are also achieved by a gas-insulated electric apparatus comprising:

an electric apparatus body including a storing space, an electric element to be insulated, the electric element housed in the storing space, and a high withstand voltage insulating gas filled in the storing space; and a radiator for cooling the high withstand voltage insulating gas, including at least one gas radiation member having a panel shape, having a gas passageway having a predetermined passageway cross section area along the longitudinal axis of the gas radiation member, at least one gas introducing header for introducing the high withstand voltage insulating gas from the electric apparatus body, the gas introducing header having a predetermined passageway cross section area, being inserted in the vicinity of one longitudinal end portion of the gas radiation member, and having a duct at a portion crossing the gas radiation member, at least one gas discharging header for discharging the high withstand voltage insulating gas to the electric apparatus body, the gas discharging header having a predetermined passageway cross section area, being inserted in the vicinity of one longitudinal end portion of the gas radiation member, and having a duct at a portion crossing the gas radiation member, wherein the improvement is that at least one of the gas introducing header and the gas discharging header is situated near a transverse end portion of the gas radiation member.

The objects are also achieved by a gas-insulated electric apparatus comprising:

an electric apparatus body including a storing space, an electric element to be insulated, the electric element housed in the storing space, and a high withstand voltage insulating gas filled in the storing space; and a radiator for cooling the high withstand voltage insulating gas, including at least one gas radiation member having a panel shape, and having a gas passageway having a predetermined passageway cross section area along the longitudinal axis of the gas radiation member, at least one gas introducing header for introducing the high withstand voltage insulating gas from the electric apparatus body, the gas introducing header having a predetermined passageway cross section area, being inserted in the vicinity of one longitudinal end portion of the gas radiation member, and having a duct at a portion crossing the gas radiation member, at least one gas discharging header for discharging the high withstand voltage insulating gas to the electric apparatus body, the gas discharging cylinder having a predetermined passageway cross section area, being inserted in the vicinity of one longitudinal end portion of the gas radiation member, and having a duct at a portion crossing the gas radiation member, wherein the improvement is that at least one of the gas introducing header and the gas discharging header has such a cross-sectional shape as to reduce the passage resistance to air rising on the outside of the gas radiation member.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 10A and FIG. 10B are a plan view showing an example of the shape of a duct of a header;

FIG. 11 is a plan view showing another example of the shape of a duct of a header;

FIG. 12 is a characteristic graph showing the relationship between a dimension a and a pressure loss in a duct of a header;

DETAILED DESCRIPTION OF THE PREFERRED EMBODIMENTS

Figure 1:
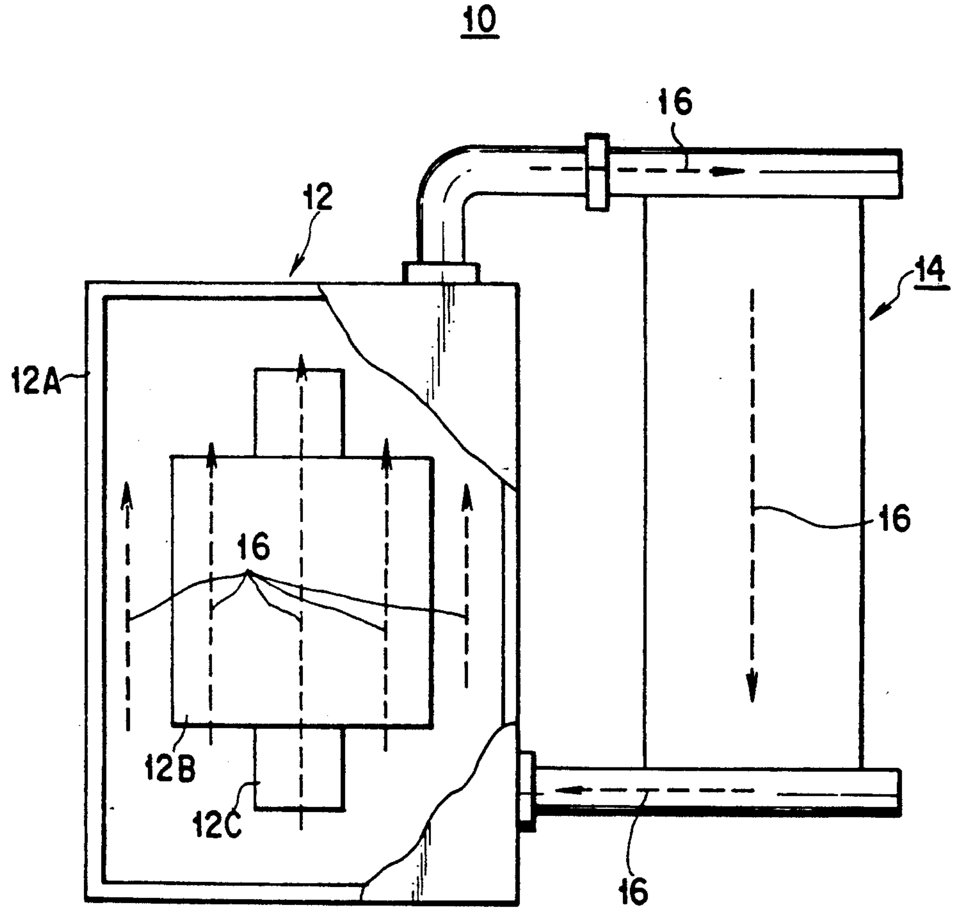
PRIOR ART FIG. 1
FIG. 1 is a front view showing a typical self-cooling type gas-insulated transformer.
Figure 2:
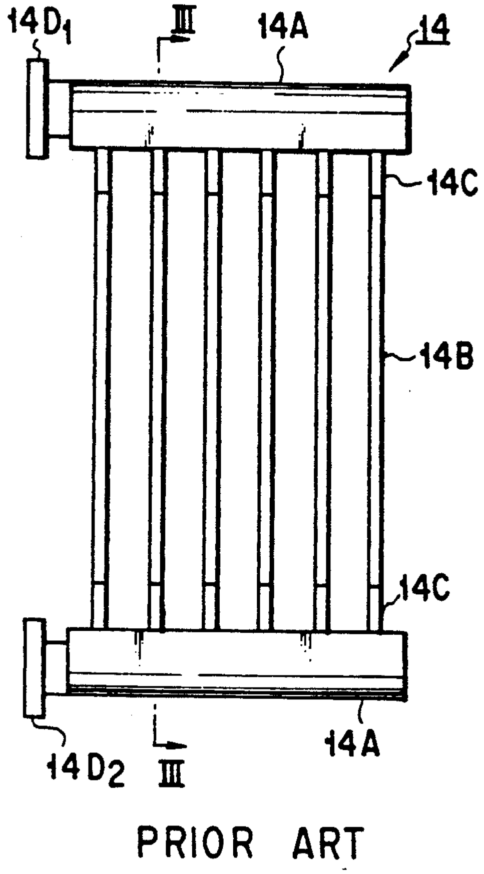
PRIOR ART FIG. 2
FIG. 2 is a front view of an example of the radiator mounted on the transformer shown in FIG. 1.
Figure 3:
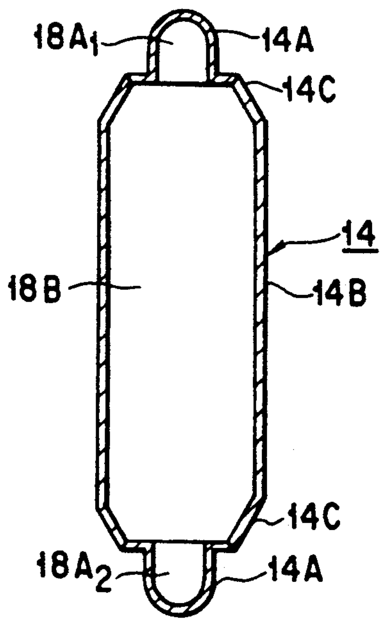
PRIOR ART FIG. 3
FIG. 3 is a cross-sectional view taken along line III—III in FIG. 2.
Figure 4:
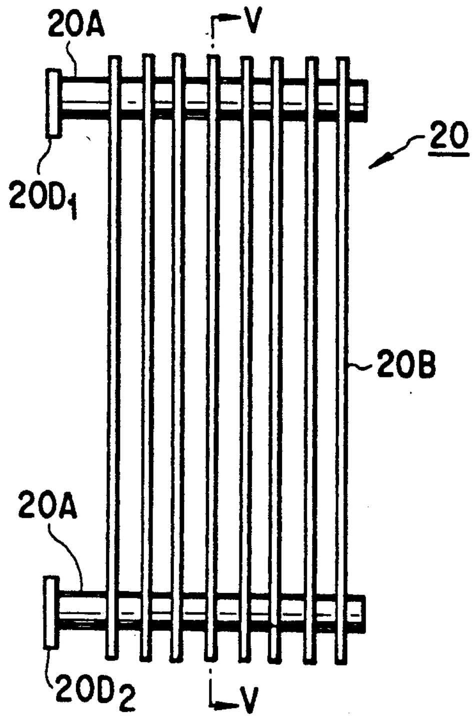
PRIOR ART FIG. 4
FIG. 4 is a front view of another example of the radiator mounted on the transformer shown in FIG. 1.
Figure 5:
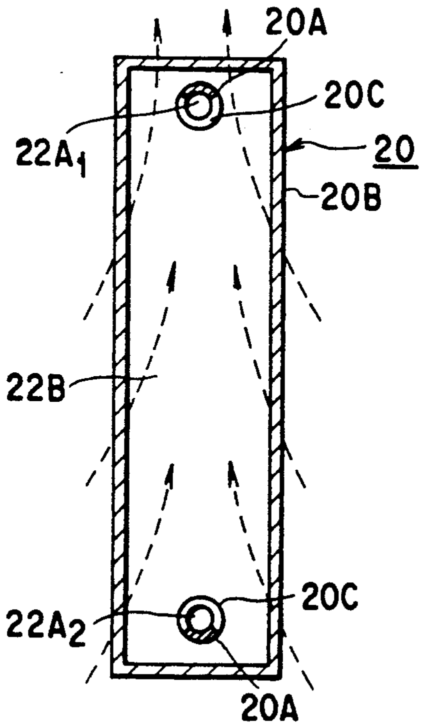
PRIOR ART FIG. 5
FIG. 5 is a cross-sectional view taken along line V—V in FIG. 4.
Figure 6:
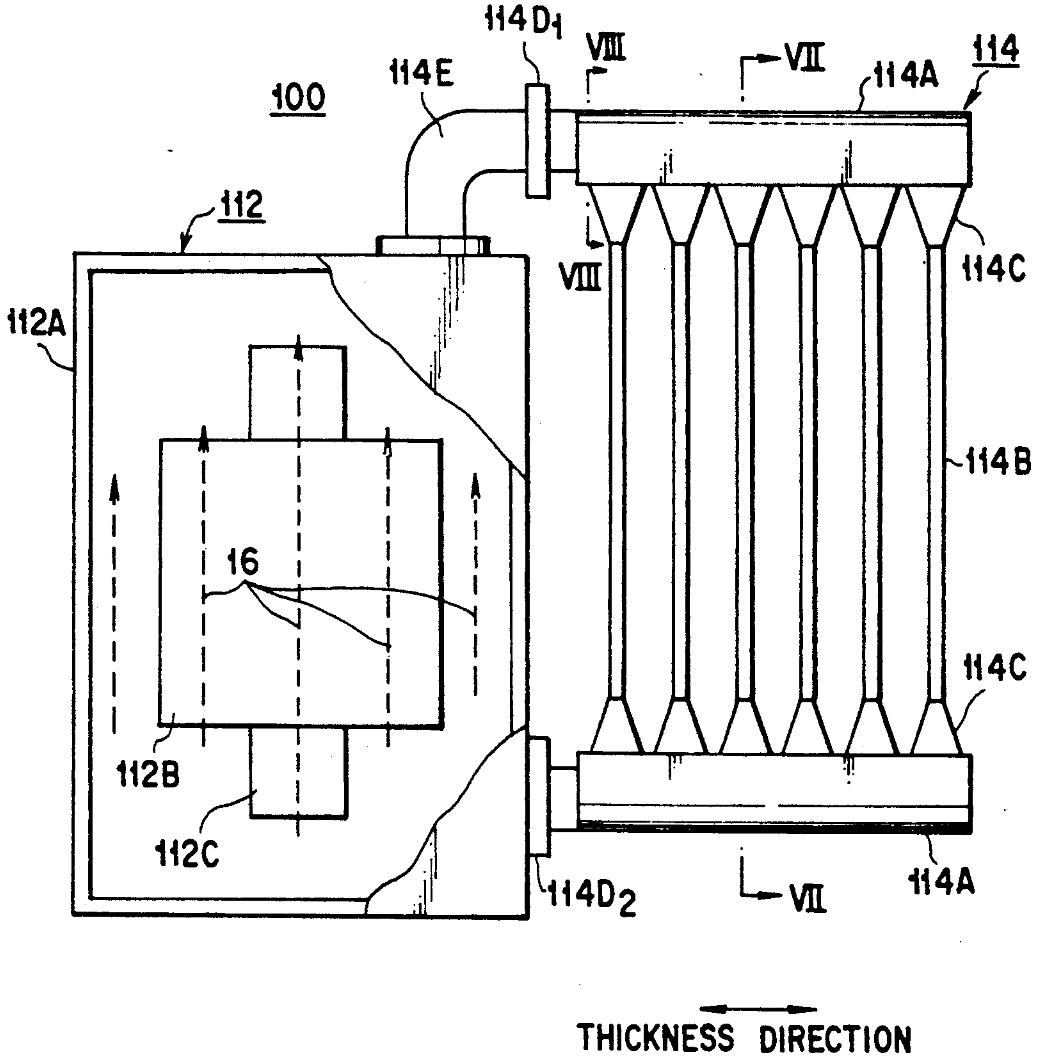
FIG. 6 is a front view of a self-cooling type gas-insulated transformer according to a first embodiment of the present invention.

A self-cooling type gas-insulated transformer according to a first embodiment of the present invention will now be described with reference to FIGS. 6 to 12. As is shown in FIG. 6, the self-cooling type gas-insulated transformer 100 comprises a transformer body 112 and a radiator 114. Main components of the transformer body 112 are a casing 112A, a coil 112B and an iron core 112C. The coil 112B and iron core 112C are situated within the casing 112A in the insulated state. A high withstand voltage insulating gas or $SF_6$ gas 16 is filled within the transformer body 112 and radiator 114.

Figure 7:
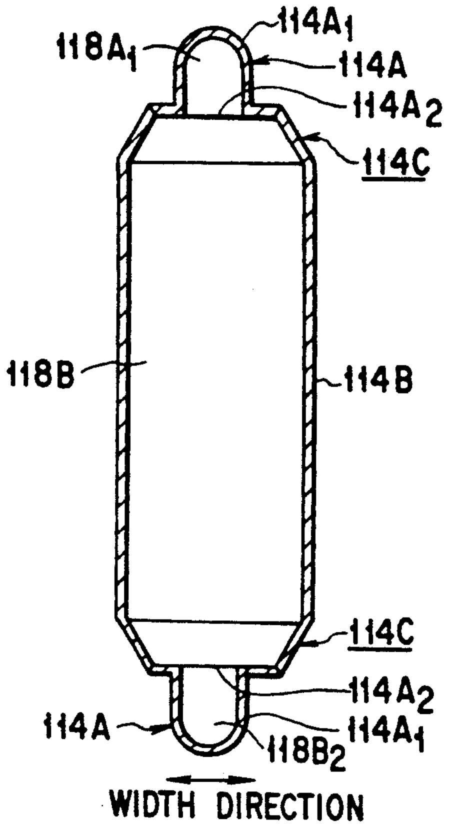
FIG. 7 is a vertical cross-sectional view taken along line VII—VII in FIG. 6.

The radiator 114 will now be described in detail with reference to FIGS. 6 to 8. A plurality of mutually distanced panels 114B or gas radiation cylindrical members, each having substantially the same thickness, are provided between an upper header 114A serving as a gas introducing cylindrical member and a lower header 114A serving as a gas discharging cylindrical member, with couplers 114C mounted on both side portions of the panels 114B.

The upper header 114A and lower header 114A have the same shape. The header 114A comprises a passageway-forming portion 114A1 with a substantially half cross section area, and a panel coupler 114A2 fixed to the passageway-forming portion 114A1. The header 114A, as a whole, is a cylindrical member having a shorter dimension or width dimension of about 170 mm. The panel coupler 114A2 has a plurality of holes along its longitudinal direction, which holes correspond to ducts 114C1 described below.

Each panel 114B is a thin box having a shorter dimension or width dimension of about 460 mm.

The couplers 114C are attached to the mutually facing surfaces of the upper and lower headers 114A. The couplers 114C control branching and confluence of the insulating gas 16 in the panels 114B. Each coupler 114C functions as a funnel for $SF_6$ gas 16. The couplers 114C are attached to the upper header 114A so as to correspond to the panels 114B, and similarly couplers 114C are attached to the lower header 114A so as to correspond to the panels 114B. These couplers 114C have the same shape.

Figure 8:
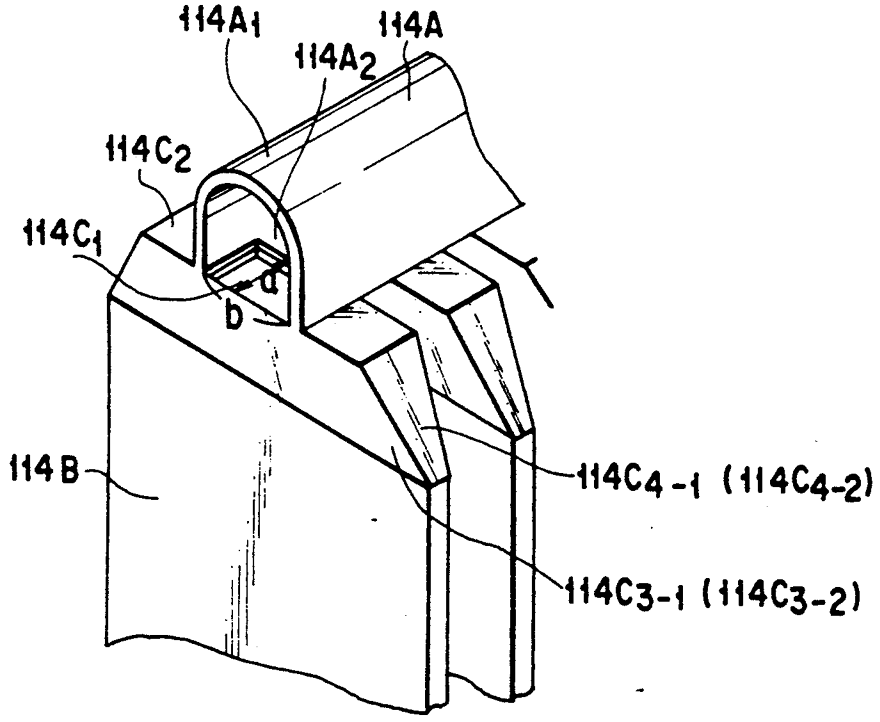
FIG. 8 is a partial perspective view taken along line VIII—VIII in FIG. 6.

As is shown in FIG. 8, each coupler 114C is a box-like member comprising a rectangular header-attachment plate 114C2, two large trapezoidal plates 114C3-1 and 114C3-2, and two small trapezoidal plates 114C4-1 and 114C4-2. The rectangular header-attachment plate 114C2 has a duct 114C1 with an area of $a \times b$ corresponding to a passageway cross section area (a is a dimension along the shorter dimension (thickness dimension) of the panel 114B, and b is a dimension along the longer dimension (width dimension) of the panel 114B).

The two large trapezoidal plates 114C3-1 and 114C3-2 face each other, and the two small trapezoidal plates 114C4-1 and 114C4-2 face each other. The shorter side portions of the large trapezoidal plates 114C3-1 and 114C3-2 are fixed to the longer side portions of the header-attachment plate 114C2, and the longer side portions of the large trapezoidal plates 114C3-1 and 114C3-2 are fixed to the longer side portions of the panel 114B. The longer side portions of the small trapezoidal plates 114C4-1 and 114C4-2 are fixed to the shorter side portions of the header-attachment plate 114C2, and the shorter side portions of the small trapezoidal plates 114C4-1 and 114C4-2 are fixed to the shorter side portions of the panel 114B.

The coupler 114C can be regarded as an inverted funnel. The thickness of the coupler 114C gradually decreases towards the panel 114B, and the width of the coupler 114C gradually increases towards the panel 114B.

Since the area of the duct 114C1 of the coupler 114C is large, $SF_6$ gas 16 coming from the header 114A can be guided into the panel 114B through the duct 114C1 having a large area (passageway cross section area), and the gas 16 flowing out of the panel 114B can be guided into the header 114A through the duct 114C1 having a large area (passageway cross section area).

An open end portion of each of the upper and lower headers 114A is provided with a flange 114D1, 114D2. The flanges 114D1 and 114D2 are connected to the transformer body 112 via connection pipes 114E. Thereby, the inside space of the transformer body 112 communicates with the inside spaces of the upper and lower headers 114A. The other end portion of each header 114A is closed. Each panel 114B has a longitudinally extending internal space. The inside spaces of the panels 114B communicate with the inside spaces of the upper and lower headers 114A. Accordingly, a closed gas passageway is formed by the mutually communicating inside spaces of the transformer body 112, upper and lower headers 114A and panels 114B.

The $SF_6$ gas filled in the closed gas passageway circulates naturally through the closed passageway, and radiates heat in the panels 114B principally, thereby cooling the inside spaces of the transformer body and radiator 114. The natural circulation of $SF_6$ gas will now be described more specifically. The $SF_6$ gas flows to a passageway 18A1 of the upper header 114A from the transformer body. Then, the gas is branched into the panels 114B, flowing vertically downwards through passageways 118B of the panels 114B. The $SF_6$ gas flowing through the passageways 118B of panels 114B is made confluent in a passageway 118A2 of the lower header 114A. The confluent $SF_6$ gas returns to the transformer body 112. In this case, when the $SF_6$ gas flows through the passageways 118B of the panels 114B, the air around the panels 114B is heated and convection occurs. By the convection, heat radiation is principally caused.

Figure 9:
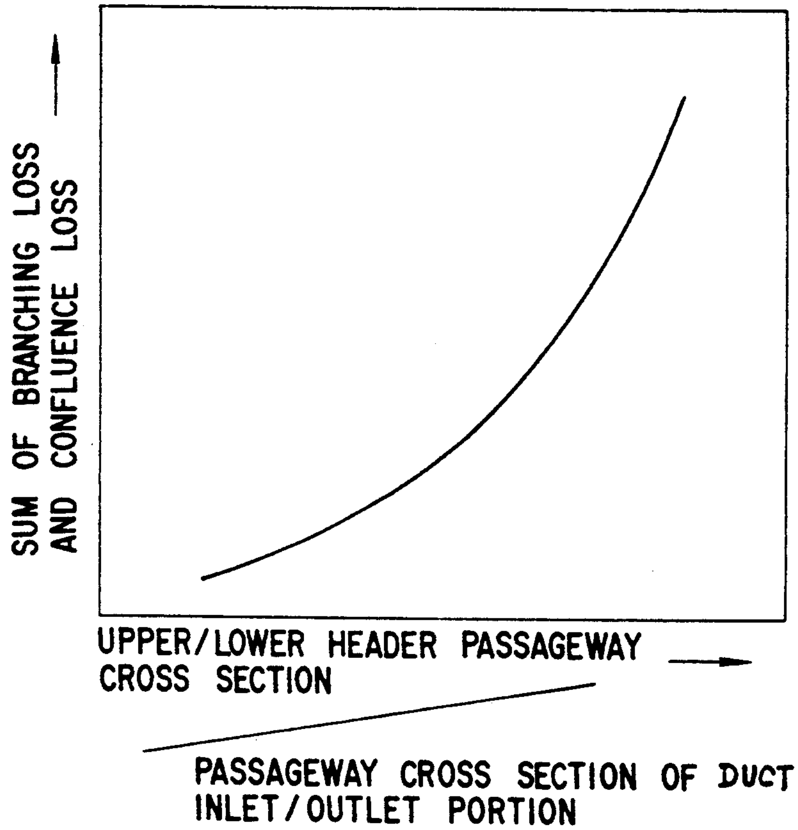
FIG. 9 is a characteristic graph showing a loss of gas flow in relation to the ratio of the cross section area of the passageway of a header to the cross section area of the passageway of a panel.

On the other hand, it is now supposed that $SF_6$ gas is circulated at a constant flow rate through the inside spaces of the transformer body 112 and the radiator 114 in which panels 114B are provided between upper and lower headers 114A. In FIG. 9, the abscissa indicates the ratio of the passageway cross section area of the upper and lower headers 114A to that of the panel duct 114C1, and the ordinate indicates the sum of the branching loss and confluence loss at the time $SF_6$ gas 16 is branched into panels 114B and is made confluent at the lower header 114A. As is clear from FIG. 9, the loss decreases abruptly when the ratio of the passageway cross section area of the header 114A to that of duct 114C1 decreases, i.e. the passageway cross section area of the inlet and outlet portions of the panel 114B increases.

In the above embodiment, the thickness of the coupler 114C is gradually decreased towards the panel 114B, and the width of the coupler 114C is gradually increased towards the panel 114B. Thus, the ratio of the passageway cross section area of the header 114A to that the duct 144C1 at the branching and confluent regions is low, the branching/confluence loss decreases, and the flow rate of naturally circulating $SF_6$ gas increases. Since the branching loss and confluence loss decrease, the flow rate at the passageway 118B of each panel 114B becomes uniform and the gas flows as a turbulent flow, not as a laminar flow. In addition, the circulation flow rate of $SF_6$ gas increases and accordingly the heat transfer coefficient increases, and the radiation performance per panel 114B is remarkably enhanced.

Thereby, the gas-insulated transformer can be made compact and installed in a limited space; in addition, the cost of the transformer can be reduced.

Desirable shapes of the duct will now be described with reference to FIGS. 10A to 12. In the above embodiment, as shown in FIG. 10A, the duct 114C1 has a rectangular shape which is defined by a dimension a along the shorter dimension (thickness) of the panel 114B and a dimension b along the longer dimension (width) of the panel 114B and has an area $a \times b$ corresponding to the passageway cross section area.

The above description is directed to the case where the width of the header 114A is about 170 mm and the width of the panel 114B is about 400 mm; however, the same function and effect can be achieved even if other dimensions are adopted.

It is also possible to adopt a duct 114C1' of a rhomboid shape defined by a diagonal dimension a' in the transverse (thickness) direction and a diagonal dimension b' in the longitudinal (width) direction.

In addition, as shown in Fig. 10B, it is possible to use a duct of an oval shape defined by the transverse dimension a (in the thickness dimension) of the panel 114B and the longitudinal dimension (in the width direction) of the panel 114B.

In the case of the rectangular duct 114C1 of FIG. 11, if the dimension a is decreased and the opening area (passageway cross section area) of the duct 114C1 is increased, the circumferential dimension of the duct 114C1' is also increased. Furthermore, it is possible to use a duct having a cross section area of a mixed shape of a rectangular shape, a rhomboid shape and/or an oval shape. As a result, the loss increases. By contrast, if the dimension a is increased excessively, the loss due to an eddy near the duct 114C1 becomes greater than the loss in the case of less dimension a.

The inventor has analyzed the relation between dimensions a and a', and obtained characteristic data shown in FIG. 12. From FIG. 12, it is understood that dimension a is $16\ mm \leqq a \leqq 45\ mm$, and, in the case of the rhomboid duct 114C1' the optimal dimension a' is $18\ mm \leqq a' \leqq 40\ mm$.

Further, it was recognized that in the case of the oval-cross section area duct, the maximum value of the transverse dimension is 40 to 45 mm and the minimum value thereof is 16 to 18 mm. In the case of the oval-cross section area duct, the optimal value is an intermediate value between that of the rectangular cross-sectional duct and that of the rhomboidal cross-sectional duct. Moreover, it is better to increase the passageway cross section area of the duct 114C, 114C' closer to the flange 114D1, 114D2 connected to the transformer body, and, inversely, to increase the dimension a, a' of the duct away from the flange 114D1, 114D2.

Figure 13:
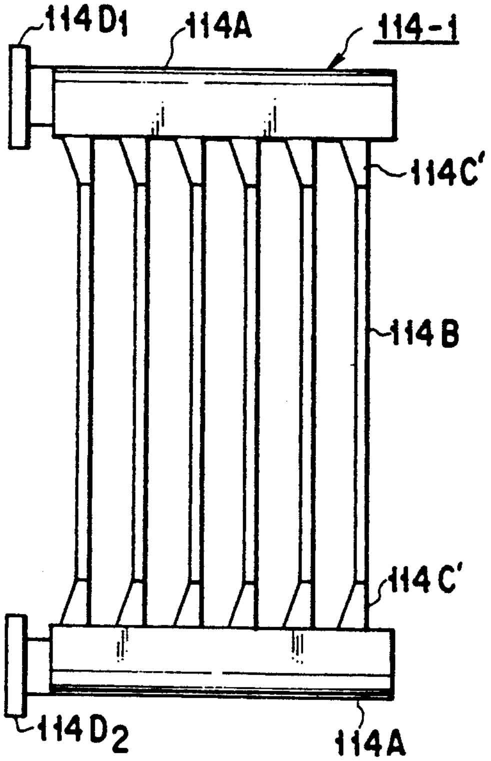
FIG. 13 is a front view of a radiator, which is a main component of a self-cooling type gas-insulated transformer according to a second embodiment of the invention.

A second embodiment of the invention will now be described with reference to FIG. 13. In the second embodiment, the same structural elements as in the first embodiment are denoted by like reference numerals, and a description thereof is omitted. Specifically, the second embodiment differs from the first embodiment only with respect to the coupler 114C'.

In the second embodiment, each coupler 114C' has an inclined portion, which is inclined in the thickness direction of the panel 114B, only on its side facing the transformer body.

In the second embodiment, too, $SF_6$ gas circulates naturally through the inside spaces of the transformer body and the radiator 114-1, and heat is radiated mainly in the panels 114B. Thus, the transformer is cooled. In this case, although the passageway cross section area of the coupler 114C' is varied only on its side facing the transformer body, the same function and effect as in the first embodiment are achieved. In addition, in the vicinity of the upper and lower headers 114A, the thickness of the panel 114B increases only on its one side; thus, the air side passageway defined on the outside of the panel 114B is enlarged and the air flow rate increases. Thus, the air side heat transfer coefficient increases.

In the first and second embodiments, the inlet and outlet portions of all panels 114B are provided with couplers 114C or 114C' for varying the passageway cross section area; however, it is not necessary to provide the couplers 114C or 114C' on those panels 114B which are away from the transformer body and in which the flow rate is relatively low. In addition, in the first and second embodiments, all couplers 114C or 114C' have the same shape; however, on the side away from the transformer body where the flow rate is relatively low, the variation in thickness of the panel may be less than that in thickness of the panel on the side close to the transformer body.

Figure 14:
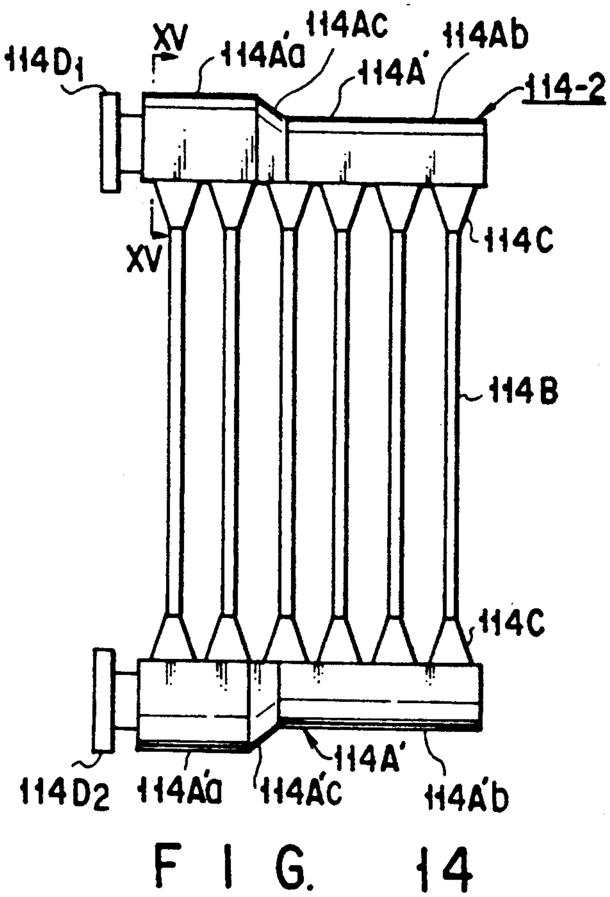
FIG. 14 is a front view of a radiator, which is a main component of a self-cooling type gas-insulated transformer according to a third embodiment of the invention.
Figure 15:
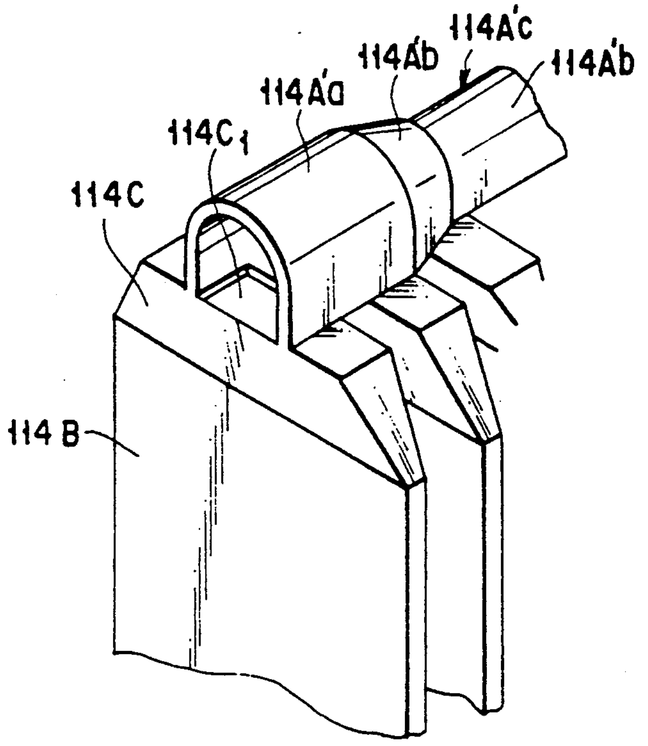
FIG. 15 is a partial perspective view taken along line XV—XV in FIG. 14.

A third embodiment of the invention will now be described with reference to FIG. 14. In the third embodiment, the same structural elements as in the first embodiment are denoted by like reference numerals, and a description thereof is omitted. Specifically, the third embodiment differs from the first embodiment only with respect to the header 114A'.

The header 114A' of the third embodiment is thick on the side close to the transformer body and thin on the side away from the transformer body, thereby varying the passageway cross section area. Specifically, the header 114A' comprises a large-diameter portion 114A'a on the side close to the transformer body, a small-diameter portion 114A'b on the side away from the transformer body, and a connection portion 114A'c for connecting the large-diameter portion 114A'a and small-diameter portion 114A'b.

In the third embodiment, too, $SF_6$ gas circulates naturally through the inside spaces of the transformer body and the radiator 114-2, and heat is radiated mainly in the panels 114B. Thus, the transformer is cooled.

According to the third embodiment, the same function and effect as in the first embodiment can be obtained. In addition, by virtue of the header 114A' having a varying passageway cross section area, the following advantage can be obtained. That is, since the header 114A' has the large-diameter portion 114A'a on the side close to the transformer body, where the gas quantity is large and the flow rate is high, no problem arises even if the gas quantity and flow rate increase. Consequently, the branching loss and confluence loss can be reduced and the flow rate of naturally circulating $SF_6$ gas can be increased. Furthermore, the flow rate of $SF_6$ gas flowing through the panels 114B can be made uniform, the heat transfer coefficient is increased, and the radiation performance per panel 114B is enhanced, whereby the size of the radiator 114-2 can be reduced.

In the third embodiment, the coupler for varying the passageway cross section area is provided at each of the inlet and outlet portions of panel 114B connected to header 114A' having a varying passageway cross section area; however, if the header 114A' can be sufficiently enlarged and the branching/confluence loss can be decreased, such a coupler can be omitted.

In the first to third embodiments, the headers have the same passageway cross section area, but may have different passageway cross section areas. The couplers for varying the passageway cross section area may be provided only at the inlet portions or outlet portions of the panels 114B. Further, only one of the headers 114A' for varying the passageway cross section area may be provided. In this case, the branching loss is generally greater than the confluence loss; thus, in order to reduce the branching loss, the header 114A' for varying the passageway cross section area may be provided only on the upper side.

Figure 16:
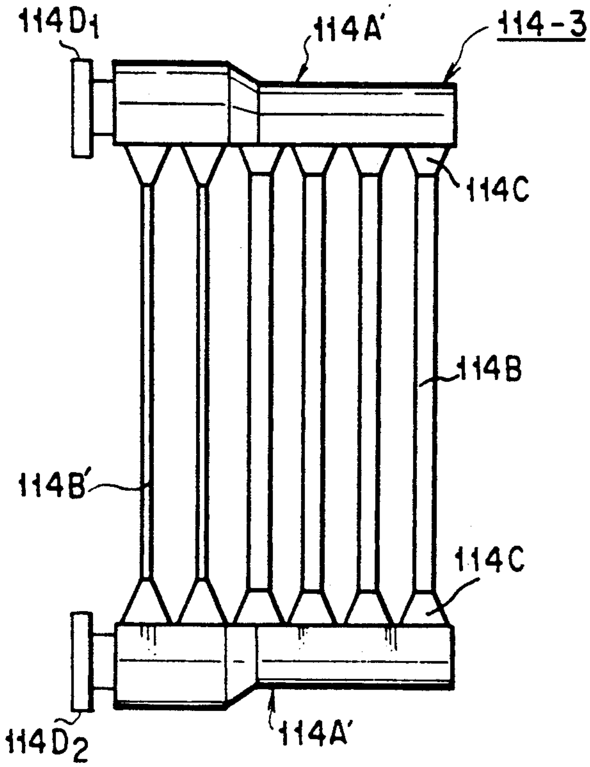
FIG. 16 is a front view of a radiator, which is a main component of a self-cooling type gas-insulated transformer according to a fourth embodiment of the invention.

A fourth embodiment of the invention will now be described with reference to FIG. 16. In the fourth embodiment, the same structural elements as in the third embodiment are denoted by like reference numerals, and a detailed description thereof is omitted. Specifically, in the fourth embodiment, panels 114B having a small passageway cross section area and panels 114B' having a large passageway cross section area are employed.

In the fourth embodiment, the panels 114B' having a large passageway cross section area are situated on the side away from the transformer body, and the panels 114B having a small passageway cross section area are situated on the side close to the transformer body.

In the fourth embodiment, too, $SF_6$ gas circulates naturally through the inside spaces of the transformer body and the radiator 114-2, and heat is radiated mainly in the panels 114B. Thus, the transformer is cooled. The same function and effect as in the third embodiment can be achieved, and a greater quantity of $SF_6$ gas can be let to flow through the panels 114B' away from the transformer body while a smaller quantity of $SF_6$ gas can be let to flow through the panels 114B close to the transformer body.

Figure 17:
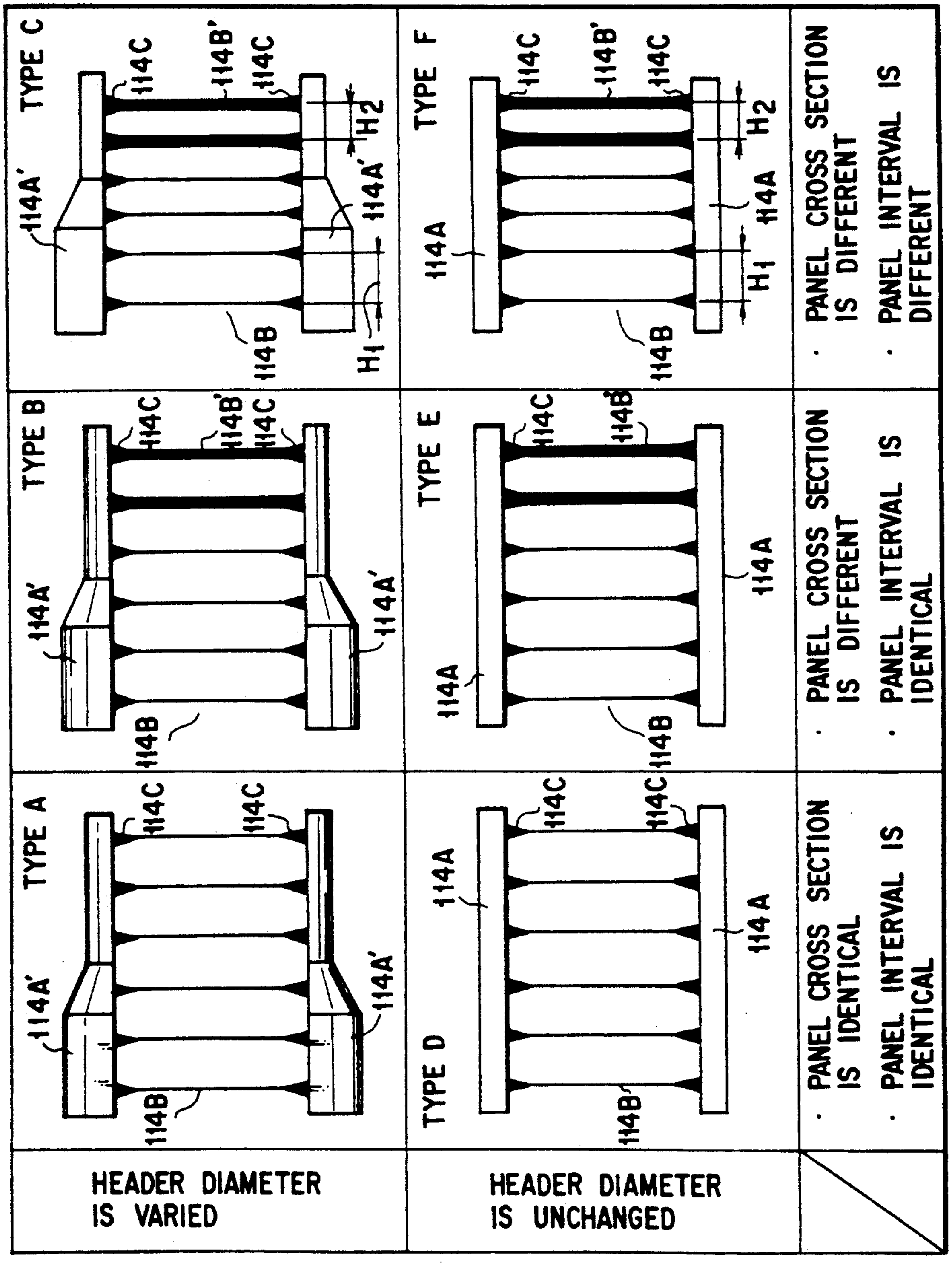
FIG. 17 shows schematically various modifications of the first embodiment of the invention, wherein the cross section areas of passageways of the headers are unchanged/varied, the cross section areas of passageways of the panels are identical/different, and the intervals between panels are identical/different.

Next, various modifications of the first embodiment of the invention will now be described with reference FIG. 17, wherein the cross section areas of passageways of the headers are unchanged/varied, the cross section areas of passageways of the panels are identical/different, and the intervals between panels are identical/different.

Type A is a radiator constituted by headers 114A' having varied passageway cross section areas, panels 114B having an identical passageway cross section area, and couplers 114C having varied passageway cross section areas on both the side close to the transformer body and the side away from the transformer body. Type A corresponds to the third embodiment.

Type B is a radiator constituted by headers 114A' having varied passageway cross section areas, panels 114B and 114B' having different passageway cross section areas, and couplers 114C having varied passageway cross section areas on both the side close to the transformer body and the side away from the transformer body.

Type C is a radiator constituted by headers 114A' having varied passageway cross section areas, panels 114B and 114B' having different passageway cross section areas, and couplers 114C having varied passageway cross section areas on both the side close to the transformer body and the side away from the transformer body. In addition, the interval H1 between the panels 114B differs from the interval H2 between the panels 114B'. Type C corresponds to the fourth embodiment.

Type D is a radiator constituted by headers 114A having an unchanged passageway cross section area, panels 114B having an identical passageway cross section area, and couplers 114C having varied passageway cross section areas on both the side close to the transformer body and the side away from the transformer body. Type D corresponds to the first embodiment.

Type E is a radiator constituted by headers 114A' having an unchanged passageway cross section area, panels 114B and 114B' having different passageway cross section areas, and couplers 114C having varied passageway cross section areas on both the side close to the transformer body and the side away from the transformer body.

Type F is a radiator constituted by headers 114A' having an unchanged passageway cross section area, panels 114B and 114B' having different passageway cross section areas, and couplers 114C having varied passageway cross section areas on both the side close to the transformer body and the side away from the transformer body. In addition, the interval H1 between the panels 114B differs from the interval H2 between the panes 114B'.

Figure 18:
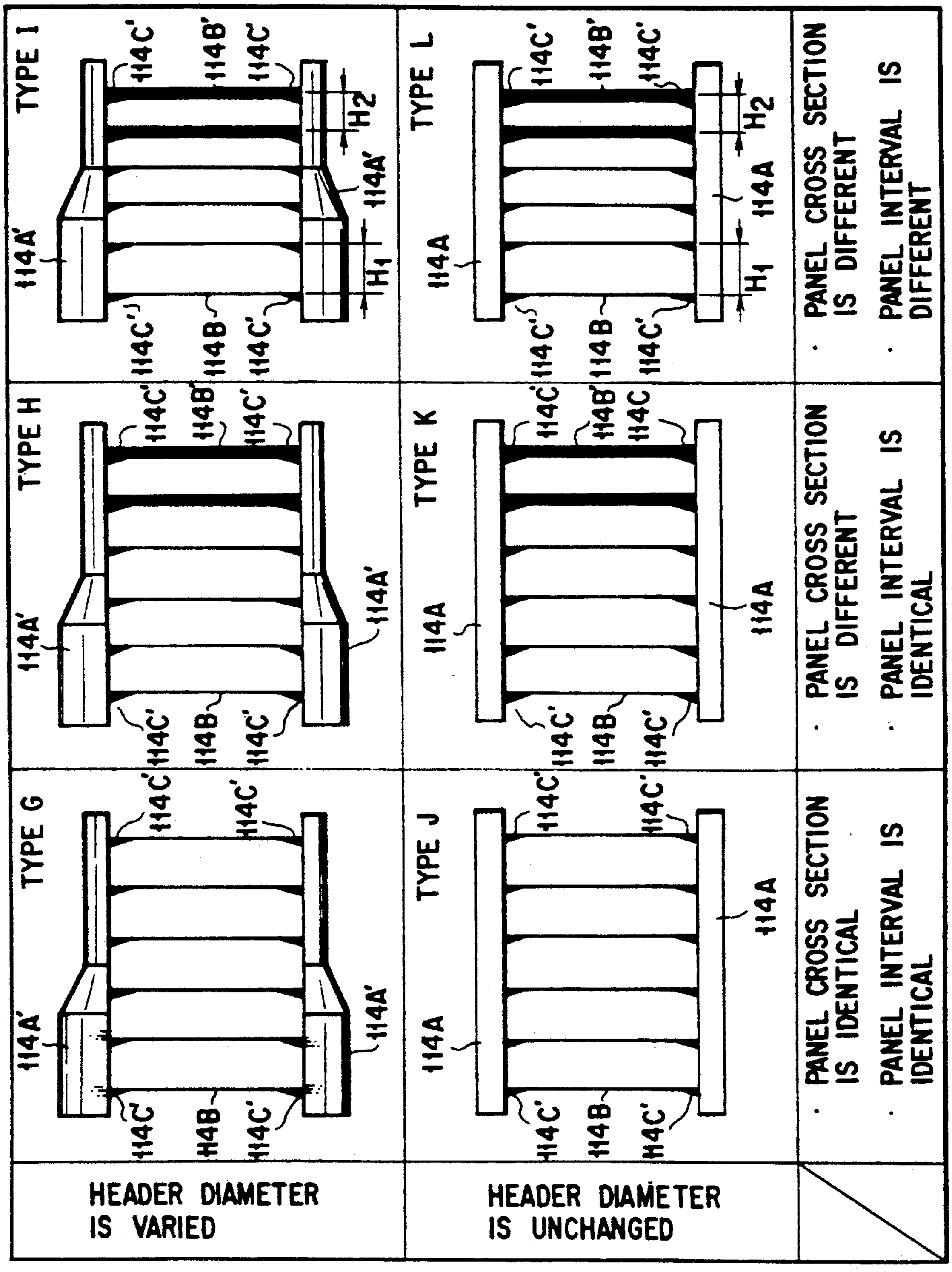
FIG. 18 shows schematically various modifications of the second embodiment of the invention, wherein the cross section areas of passageways of the headers are identical/different, the cross section areas of passageways of the panels are identical/different, and the intervals between panels are identical/different.

Then, various modifications of the second embodiment of the invention will now be described with reference FIG. 18, wherein the cross section areas of passageways of the headers are unchanged/varied, the cross section areas of passageways of the panels are identical/different, and the intervals between panels are identical/different.

Type G is a radiator constituted by headers 114A' having varied passageway cross section areas, panels 114B having an identical passageway cross section area, and couplers 114C' having a varied passageway cross section area only on the side close to the transformer body.

Type H is a radiator constituted by headers 114A' having varied passageway cross section areas, panels 114B and 114B' having different passageway cross section areas, and couplers 114C' having a varied passageway cross section area only on the side close to the transformer body.

Type I is a radiator constituted by headers 114A' having varied passageway cross section areas, panels 114B and 114B' having different passageway cross section areas, and couplers 114C' having a varied passageway cross section area only on the side close to the transformer body. In addition, the interval H1 between the panels 114B differs from the interval H2 between the panels 114B'. Type C corresponds to the fourth embodiment.

Type J is a radiator constituted by headers 114A having an unchanged passageway cross section area, panels 114B having an identical passageway cross section area, and couplers 114C' having a varied passageway cross section area only on the side close to the transformer body. Type J corresponds to the second embodiment.

Type K is a radiator constituted by headers 114A' having an unchanged passageway cross section area, panels 114B and 114B' having different passageway cross section areas, and couplers 114C' having a varied passageway cross section area only on the side close to the transformer body.

Type L is a radiator constituted by headers 114A' having an unchanged passageway cross section area, panels 114B and 114B' having different passageway cross section areas, and couplers 114C' having a varied passageway cross section area only on the side close to the transformer body. In addition, the interval H1 between the panels 114B differs from the interval H2 between the panels 114B'.

Figure 19:
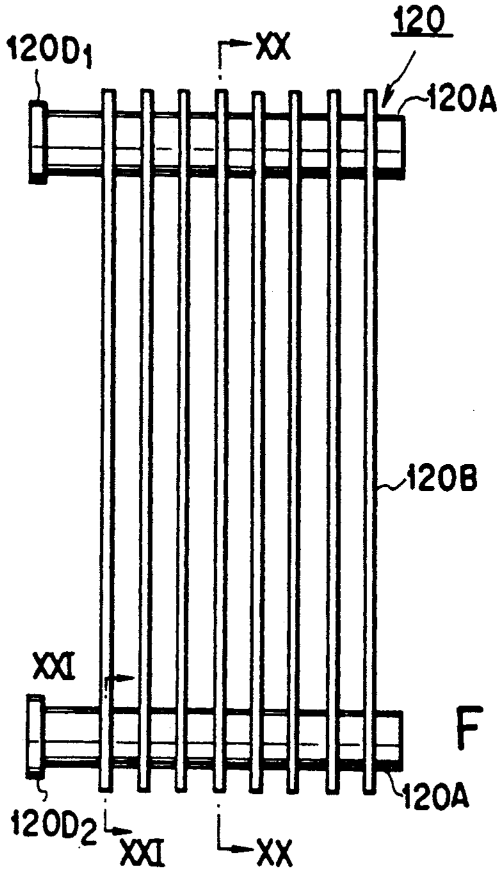
FIG. 19 is a front view of a radiator, which is a main component of a self-cooling type gas-insulated transformer according to a fifth embodiment of the invention.
Figure 20:
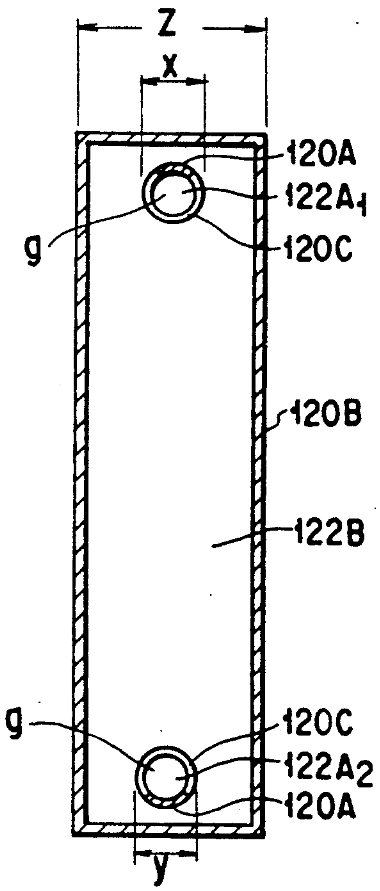
FIG. 20 is a cross-sectional view taken along line XX—XX in FIG. 19.
Figure 21:
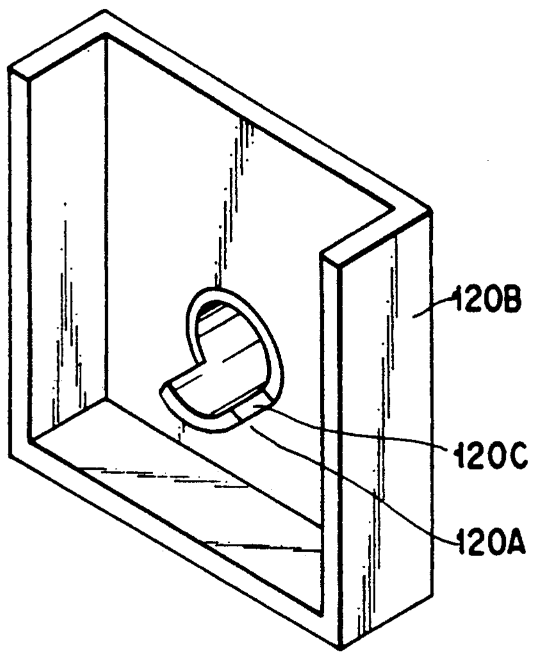
FIG. 21 is a cross-sectional view taken along line XXI—XXI in FIG. 19.
Figure 22:
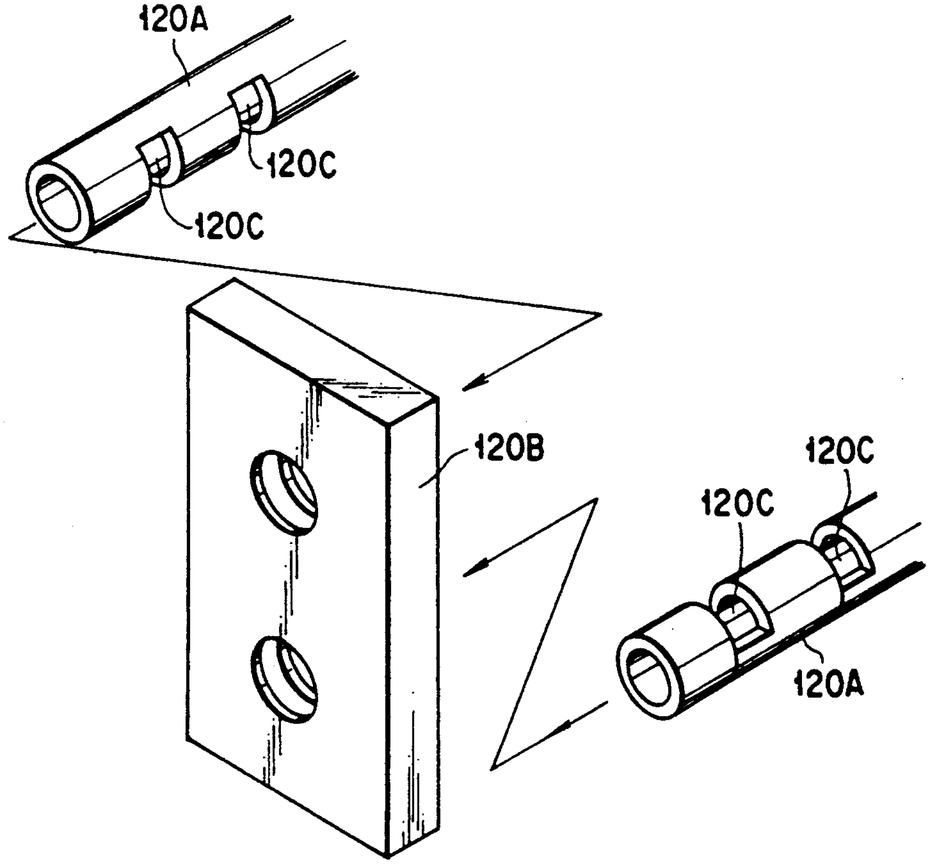
FIG. 22 is a perspective view showing schematically a process of manufacturing the radiator according to the fifth embodiment of FIG. 19.
Figure 23:
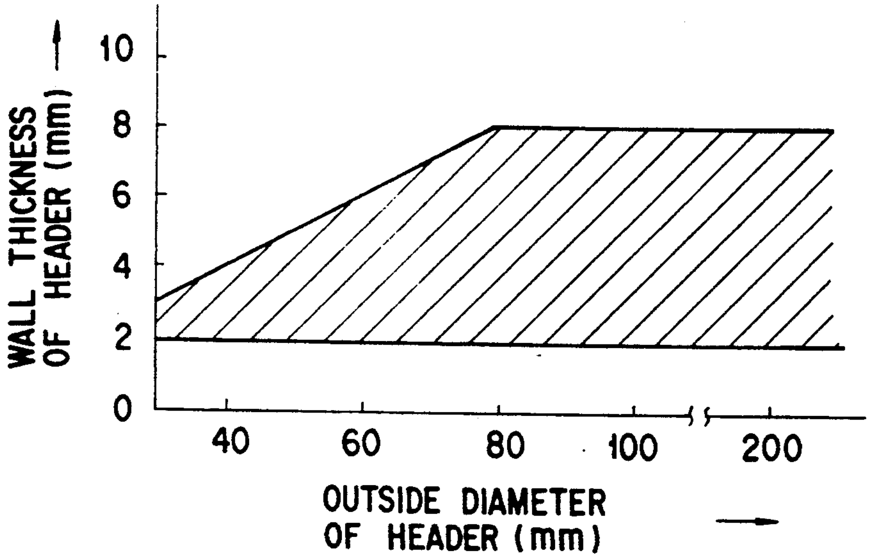
FIG. 23 is a graph showing the relationship between the outside diameter of a header and the wall thickness of the header.

A fifth embodiment of the invention will now be described with reference to FIGS. 19 to 25. A radiator 120 according to the fifth embodiment shown in FIG. 19 is connected to a transformer body of a self-cooling type gas-insulated transformer (not shown). The radiator 120 comprises an upper cylindrical header 120A, a lower cylindrical header 120A, and a plurality of mutually distanced panels 120B having substantially the same thickness, which are arranged along the longitudinal axes of the headers 120A. This will be easily understood from FIG. 22.

The upper and lower headers 120A have a plurality of ducts 120C along their longitudinal axes. The structure of the panels 120B and ducts 120C will be clearly understood by referring to FIG. 21.

The outside diameter x, y of the header 120A is determined as follows:

$$x \text{ (or } y) < 0.36\, z$$

The passageway cross section area g of the header 120A is determined as follows:

$$g > \pi/4\, (0.25\, z)^2$$

where z is the width of the panel 120B.

Regarding the above, the panels 120B each having holes at both ends are prepared. The upper and lower headers 120A are inserted into the holes of the panels 120B. The positions of the holes at both ends of the panels 120B are aligned with the positions of the ducts 120C of the upper and lower headers 120A, and the panels 120B are fixed to the upper and lower headers 120A by means of welding, etc. The ducts 120C of the upper header 120A face the ducts 120C of the lower header 120A. The ducts 120C of the upper and lower headers 120A control the branching and confluence of the insulating gas 16 in the panels 120B. The procedures for assembling the headers 120A and panels 120B will be clearly understood by referring to FIG. 22.

An open end portion of each of the upper and lower headers 120A is provided with a flange 120D1, 120D2. The flanges 120D1 and 120D2 are connected to the transformer body (not shown). Thereby, the inside space of the transformer body communicates with the inside spaces of the upper and lower headers 120A. The other end portion of each of the upper and lower headers 120A is closed. Each panel 120B has a longitudinally extending inside space. The inside spaces of the panels 120B communicate with the inside spaces of the upper and lower headers 120A. Accordingly, a closed gas passageway is formed by the mutually communicating inside spaces of the transformer body, upper and lower headers 120A and panels 120B.

The $SF_6$ gas filled in the closed gas passageway circulates naturally through the closed passageway, and radiates heat in the panels 120B principally, thereby cooling the inside spaces of the transformer body and radiator 120. The natural circulation of $SF_6$ gas will now be described more specifically. The $SF_6$ gas flows to a passageway 122A1 of the upper header 120A from the transformer body. Then, the gas is branched into the panels 120B, flowing vertically downwards through passageways 122B of the panels 120B. The $SF_6$ gas flowing through the passageways 122B of panels 120B is made confluent in a passageway 122A2 of the lower header 120A. The confluent $SF_6$ gas returns to the transformer body.

In the above, when the $SF_6$ gas flows through the passageways 122B of the panels 120B, the air around the panels 120B is heated and convection occurs. By the convection, heat radiation is principally caused. When the gas flows in the passageways 122B of panels 120B in turbuent flows, radiation efficiency is increased.

The fifth embodiment is characterized by dimensions x, y and g of each header 120A. The dimensions x, y and g are determined on the basis of the following experiments and confirmations. Specifically, the outside diameter x (x=y) of the header 120A is varied within a range of about 40 mm to 200 mm indicated by hatched lines in FIG. 23.

The wall thickness of the header 120A is determined to 2 mm to 8 mm in consideration of practical strength.

The width z of the panel 120B is 400 mm.

In the radiator 120 with the above dimensions, $SF_6$ gas was circulated to perform a cooling operation.

Figure 24:
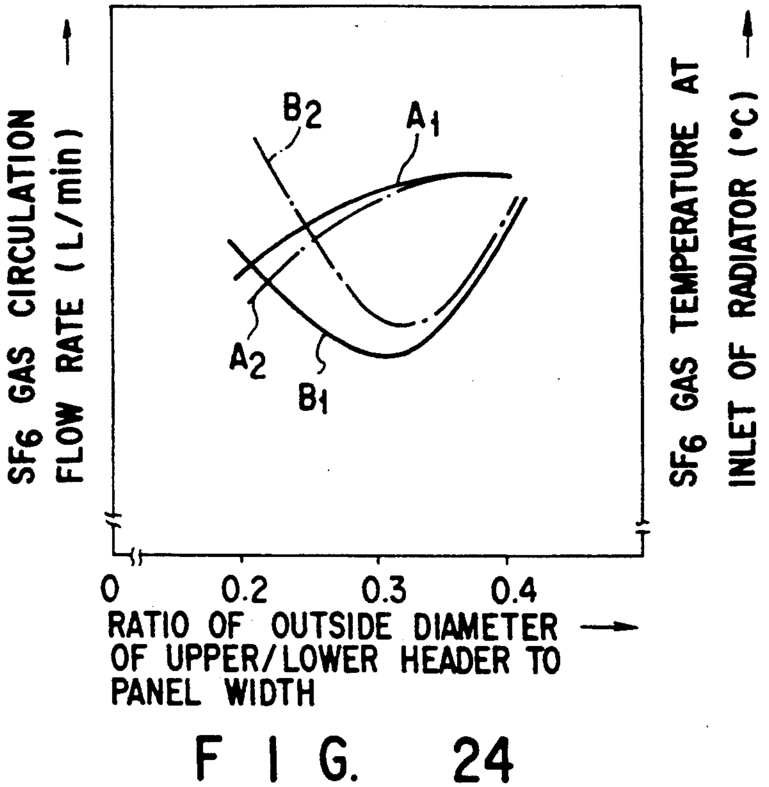
FIG. 24 is a characteristic graph showing the relationship between the flow rate of a naturally circulating gas and the gas temperature at the entrance portion of a radiator.

First, the cooling operation was carried out by natural circulation. The results of the cooling operation are shown in FIG. 24, wherein the abscissa indicates the outside diameter x, y of the header 120A to the width z of the panel 120, and the ordinate indicate the circulation flow rate of $SF_6$ gas and the $SF_6$ gas temperature in the vicinity of the flange 120D1. In the case where the wall thickness of the upper (lower) header 120A is 2 mm, the $SF_6$ gas circulation flow rate $A_1$ s as the outside diameter of the upper (lower) header 120A increases. The reason for this is that if the outside diameter of the upper (lower) header 120A increases, then the passageway cross section area increases accordingly, the gas velocity decreases, and the branching loss and confluence loss decrease. In addition, in the case where the wall thickness of the upper (lower) header 120A is 8 mm, the $SF_6$ gas circulation flow rate $A_2$ increases as the outside diameter of the upper (lower) header 120A increases. The reason for this is that if the outside diameter of the upper (lower) header 120A increases, then the passageway cross section area increases accordingly, the gas velocity decreases, and the branching loss and confluence loss decrease.

On the other hand, if the outside diameter of the upper (lower) header 120A increases, the gas circulation flow rate increases and, as a result, the heat transfer coefficient increases. However, if the outside diameter of the header 120A increases excessively, the convection of heated air around the panel 120B is prevented and the air side heat transfer coefficient decreases; consequently, the radiation performance is degraded. The radiation performance of the panel 120B takes a minimum value when the ratio of the outside diameter x (y) of the upper (lower) header 120A to the width z of the panel 120B is about 0.3 to 0.33. In FIG. 24, this radiation performance is illustrated by a curve indicating the $SF_6$ gas temperature $B_1$ in the vicinity of the flange 120D1 in the case where the wall thickness of the panel 120B is 2 mm and a curve indicating the $SF_6$ gas temperature $B_2$ in the vicinity of the flange 120D1 in the case where the wall thickness of the panel 120B is 8 mm.

The same confirmation was carried out with respect to the panel 120B having a width more than 400 mm. The radiation performance takes a minimum value similarly when the ratio of the outside diameter of the upper (lower) header 120A to the width z of the panel 120B is about 0.3 to 0.36.

Figure 25:
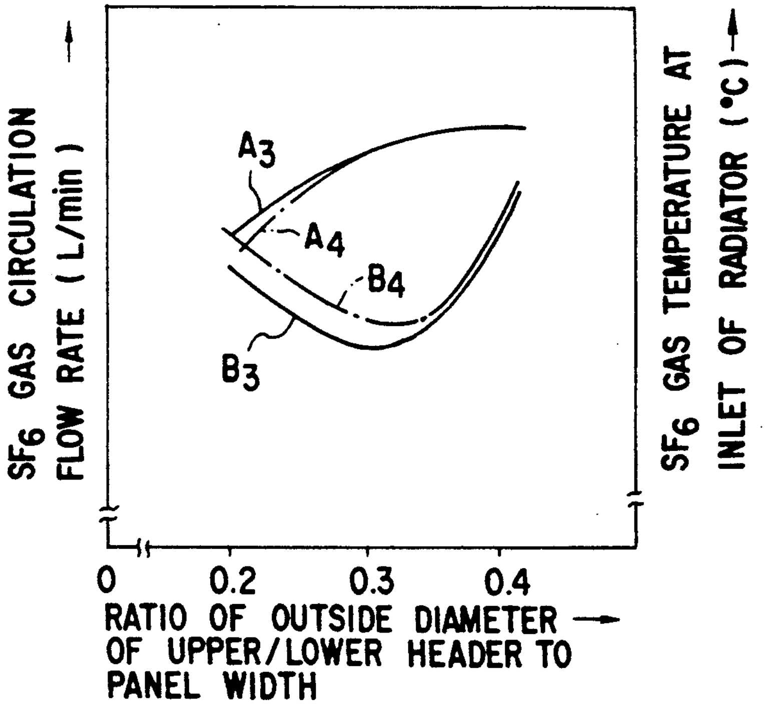
FIG. 25 is a characteristic graph showing the relationship between the flow rate of a circulating gas, circulated by a blower, and the gas temperature at the entrance portion of a radiator.

In the above experiment, the cooling operation was performed by naturally circulating $SF_6$ gas. In addition, a blower for circulating $SF_6$ gas was inserted into the gas passageway, and the $SF_6$ gas was forcibly circulated, with a fixed output of the blower, thereby performing the cooling operation. Similarly with the above, the respective values were plotted, as shown in FIG. 25. It was understood that, as with the case of natural circulation, when the wall thickness of the upper (lower) header 120A is 2 mm and 8 mm, the $SF_6$ gas circulation flow rates $A_3$ and $A_4$ increase as the outside diameter of the upper (lower) header 120A increases. The reason for this is that if the outside diameter of the upper (lower) header 120A increases, then the passageway cross section area increases accordingly and the branching loss and confluence loss decrease. Since the passageway cross section area increases, the gas circulation flow rate increases and the heat transfer coefficient increases; however, if the outside diameter of the header 120A increases excessively, the convection of heated air around the panel 120B is prevented and the air side heat transfer coefficient decreases; consequently, the radiation performance is degraded. This is understandable from FIG. 25. In FIG. 25, refer to a curve indicating the $SF_6$ gas temperature $B_3$ in the vicinity of the flange 120D1 in the case where the wall thickness of the panel 120B is 2 mm and a curve indicating the $SF_6$ gas temperature $B_4$ in the vicinity of the flange 120D1 in the case where the wall thickness of the panel 120B is 8 mm. Then it is understood that the radiation performance of the panel 120B takes a minimum value when the ratio of the outside diameter x (y) of the upper (lower) header 120A to the width z of the panel 120B is about 0.3 to 0.36.

From the above results, the $SF_6$ gas circulation flow rate does not increase remarkably even if the ratio of the outside diameter of the upper (lower) header 120A to the width of the panel 120B exceeds 0.36. Inversely, if the ratio of the outside diameter of the upper (lower) header 120A to the width of the panel 120B exceeds 0.36, the $SF_6$ gas temperature in the vicinity of the flange 120D1 at the inlet of the radiator 120 increases considerably. From these two facts, it is clear that if the ratio of the outside diameter of the upper (lower) header to the width of the panel 120B is 0.36 or above, the cooling performance is degraded. However, in FIG. 24, if the ratio of the outside diameter of the header 20A to the width of the panel 120B is, for example, 0.2, the $SF_6$ gas flow rate is lower than in the case of the ratio of 0.36. In addition, the $SF_6$ gas temperature at the inlet of the radiator increases and the cooling performance is degraded.

As another method of examining the cooling performance, the surface temperature of the upper part of the coil situated within the transformer body was detected. Of course, the lower the surface temperature of the upper part of the coil, the higher the cooling performance. It was confirmed that if the ratio of the inside diameter of the header to the width of the panel 120B is 0.25 or above, the surface temperature of the upper part of the coil is lower than in the case where the ratio of the outside diameter of the upper (lower) header 120A to the width of the panel 120B is 0.36.

The ratio, 0.25, of the inside diameter to the width of the panel 120B indicates that the ratio of the outside diameter of the upper (lower) header 120A to the width of the panel 120B is 0.26 when the panel 120B has a width of 400 mm and a wall thickness of 2 mm, and also that the ratio of the outside diameter of the upper (lower) header 120A to the width of the panel 120B is 0.29 when the panel 120B has a width of 400 mm and a wall thickness of 8 mm.

Thus, if the ratio of the outside diameter of the header 120A to the width of the panel 120B is determined to 0.36 or less and the ratio of the inside diameter of the header 120A to the width of the panel 120B is 0.25 to above, a large gas passageway can be obtained while not preventing the convection of outside air. In addition, the $SF_6$ gas circulation flow rate and the $SF_6$ gas temperature at the inlet of the radiator can be determined to enhance the practical cooling performance.

In this embodiment, too, the fluid resistance in the gas passageway can be reduced, the convection of heated air around the panel 120B is not prevented, and the insulating gas circulation flow rate can be increased while the air side heat transfer performance is not decreased so much. Thereby, the heat transfer coefficient of the radiator 120 is increased, and the radiation performance enhanced. Even if the insulating gas having a lower heat transfer performance than the insulating oil is employed as a cooling medium, a high cooling performance can be obtained. As a result, the transformer can be installed in a limited space, and the size and cost thereof can be reduced.

In the fourth embodiment, the upper and lower headers 120A have the same cylindrical shape; however, the present invention is not limited to this. The header may have a circular shape, an oval shape, a polygonal shape, etc. Needless to say, the above embodiments may be combined.

A modification of the fifth embodiment will now be described. In this modification, the width of the panel in the fifth embodiment is 400 mm or less.

The outside diameter x, y of the header is determined as follows:

$$x \text{ (or } y) < (0.36 \times (1 + (400 - z)/400))^2$$

The passageway cross section area g of the header is determined as follows:

$$g > \pi/4 \times (0.25z \times (1 + (400 - z)/400))^2$$

where z is the width of the panel.

The dimensions x, y and z are determined on the basis of the confirmation by experiments similar to those in the fifth embodiment.

The reason why the outside diameter of the header is greater than in the case where the panel width is 400 mm is as follows:

The air flowing between the panels comes from the lower end and the surrounding of the panels. Thus, the less the panel width, the greater the degree of heat exchange with cold air. In addition, the less the panel width, the less the quantity of exchanged heat. Accordingly, the average temperature of air between the panels lowers and the velocity of rising air lowers. In other words, the air flow between the panels is less influenced by the header, in accordance with the decrease in width of the panel.

Figure 26:
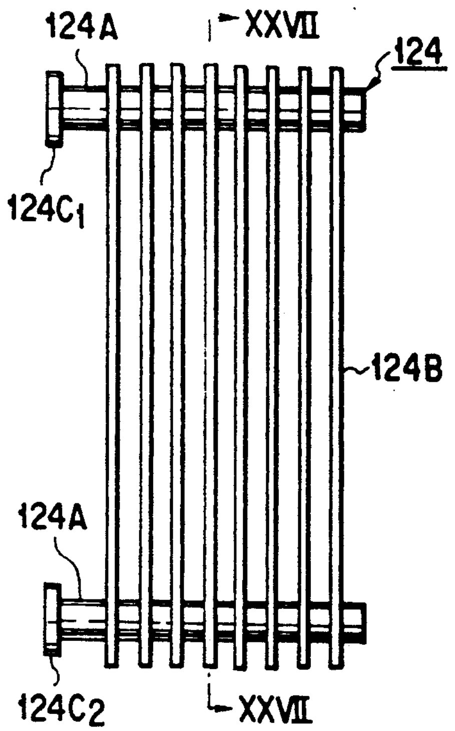
FIG. 26 is a front view of a radiator, which is a main component of a self-cooling type gas-insulated transformer according to a sixth embodiment of the invention.
Figure 27:
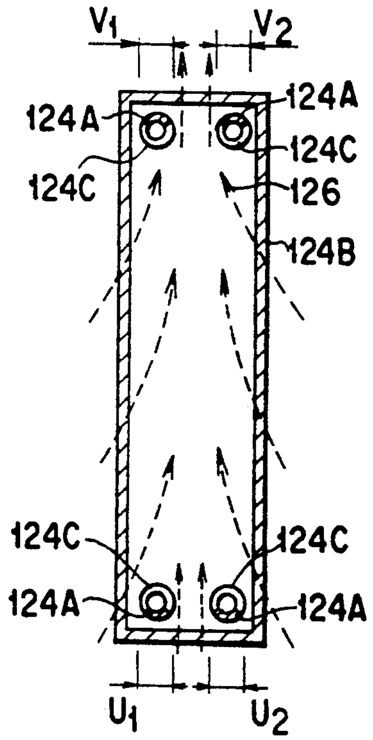
FIG. 27 is a cross-sectional view taken along line XXVI—XXVI in FIG. 26.

A sixth embodiment of the invention will now be described with reference to FIGS. 26 and 27. A radiator 124 according to the sixth embodiment shown in FIG. 26 is connected to a transformer body of a self-cooling type gas-insulated transformer (not shown). The radiator 124 comprises two upper cylindrical headers 124A and two lower cylindrical headers 124A, and a plurality of mutually distanced panels 124B which have substantially the same thickness and are arranged along the longitudinal axes of the headers 124A. Accordingly, the two upper headers 124A and two lower headers 124A are situated at both longitudinal end portions of each panel 124B, and situated at both transverse end portions of each panel 124B. In other words, the two upper headers 124A and two lower headers 124A are situated at the four corners of each panel 124B. This means that the headers 124A are not situated at the middle part in the width direction of each panel 124B.

Each of the two upper headers 124A and two lower headers 124A has a plurality of ducts 124C along the longitudinal axis thereof.

An open end portion of each of the two upper headers 124A and two lower headers 124A is provided with flanges 124C1, 124C2. The flanges 124C1 and 124C2 are connected to the transformer body (not shown). Thereby, the inside space of the transformer body communicates with the inside spaces of the upper and lower headers 124A. The other end portion of each of the upper and lower headers 124A is closed. Each panel 124B has a longitudinally extending inside space. The inside spaces of the panels 124B communicate with the inside spaces of the upper and lower headers 124A. Accordingly, a closed gas passageway is formed by the mutually communicating inside spaces of the transformer body, upper and lower headers 124A and panels 124B.

The ducts 124C of the two upper headers 124A face the ducts 124C of the two lower headers 124A. The ducts 124C of the upper and lower headers 124A control the branching and confluence of the insulating gas 16 in the panels 124B.

As is well known, the air velocity of air 126 around the panel 124B is higher at an upper region, and the air velocity distribution at the same height is higher at a longitudinal middle region of the panel 124B. Thus, by avoiding the upper middle part of the panel 124B, where the air velocity is highest, the air resistance (pressure loss) is reduced and smooth flow is attained.

On the other hand, the ambient air temperature of the panel 124B increases towards the center area of the panel 214B. Since the headers 124A are not coupled to the middle part (in the width direction) of the panels 124B, cold air 126 is easily supplied from the lower part of the panels 124B and the radiation performance is enhanced.

Specifically, if the headers 124A are coupled to the corner portions of the panels 124B, convection of air 126 around the panels 124B is smoothed and cold air can be supplied to the lower part of the panels 124B. Without lowering the circulation flow rate of the insulating gas, the air side heat transfer performance can be enhanced. Thus, the radiation performance per panel can be enhanced remarkably, the transformer can be installed in a limited space and the size and cost of the transformer can be reduced.

In the above embodiment, the cross-sectional shape of the header 124A may be circular, semi-circular, oval, rectangular, etc. The lengths V1, V2, U1 and U2 (in FIG. 27) of the regions where the headers 124A prevent flow of air around the panel 124B can be freely chosen.

Figure 28:
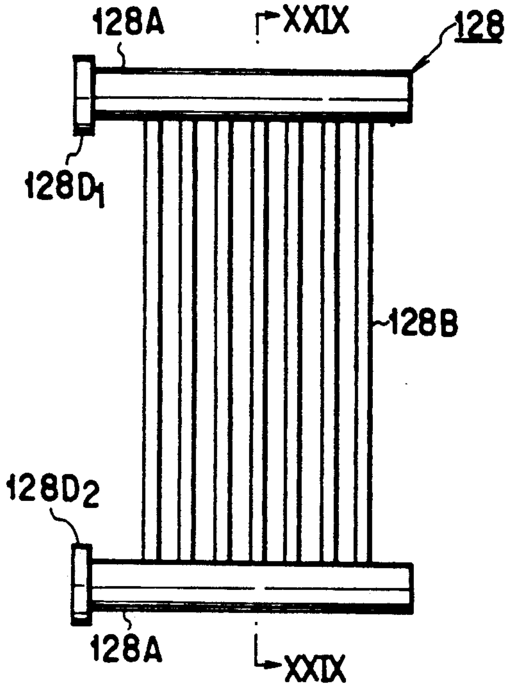
FIG. 28 is a front view of a radiator, which is a main component of a self-cooling type gas-insulated transformer according to a seventh embodiment of the invention.
Figure 29:
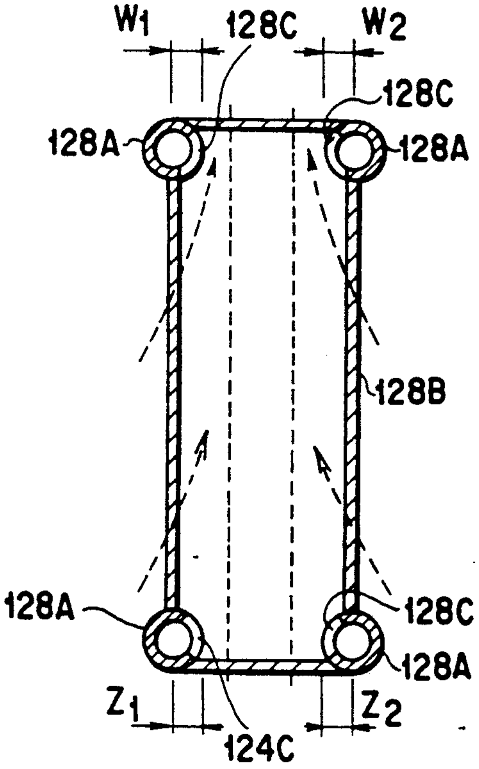
FIG. 29 is a cross-sectional view taken along line XXIX—XXIX in FIG. 28.

A seventh embodiment of the invention will now be described with reference to FIGS. 28 and 29. A radiator 128 according to the seventh embodiment shown in FIG. 28 is connected to a transformer body of a self-cooling type gas-insulated transformer (not shown). The radiator 128 comprises two upper cylindrical headers 128A and two lower cylindrical headers 128A, and a plurality of mutually distanced panels 128B which have substantially the same thickness and are arranged along the longitudinal axes of the headers 128A.

In this embodiment, the headers 128A are not situated at the middle part in the width direction of the panel 128B. Parts of the headers 128A are exposed at both end portions in the width direction of the panel 128B. Accordingly, the upper and lower headers 128A are situated at both longitudinal end portions of each panel 128B, and situated at both transverse end portions of each panel 128B. That is, the two upper headers 128A and two lower headers 128A are situated at the four corners of each panel 128B, with parts of the headers 128A exposed.

The upper and lower headers 128A have a plurality of ducts 128C along their longitudinal axes.

According to the structure of the seventh embodiment, even if the size of each header 128A and/or the number of headers 128A is increased, the flow of the air around the panel 128B is hardly prevented by the headers 128A, as indicted by broken-line arrows. Thus, the air side heat transfer performance and the insulating gas circulation flow rate can be increased more than in the sixth embodiment. The radiation performance per panel can be enhanced remarkably.

In the above embodiment, the cross-sectional shape of the header may be circular, semi-circular, oval, rectangular, polygonal, etc. The lengths W1, W2, Z1 and Z2 of the regions where the headers 128A prevent flow of air around the panel 128B can be freely chosen.

In the sixth and seventh embodiments, two headers are provided on the inlet (upper) side and on the outlet (upper) side. If the panel has a sufficient length, only one header for outlet may be provided at the lower middle part of the panel, as in the prior art. Even if this construction is adopted, the influence on the downstream of air around the panel is small. Inversely, when the panel is short, only one header for inlet may be provided at the upper middle part of the panel. Even if this construction is adopted, the influence on the flow of air around the panel is small. Thus, in some cases, one of the two upper or lower headers may be omitted, and consequently the welding step and the step of attaching one end portion of the header to the transformer body can be omitted, resulting in a decrease in cost.

Figure 30:
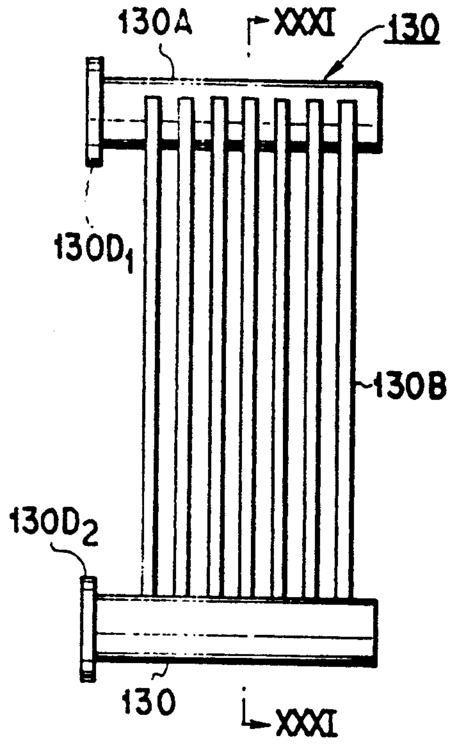
FIG. 30 is a front view of a radiator, which is a main component of a self-cooling type gas-insulated transformer according to an eighth embodiment of the invention.
Figure 31:
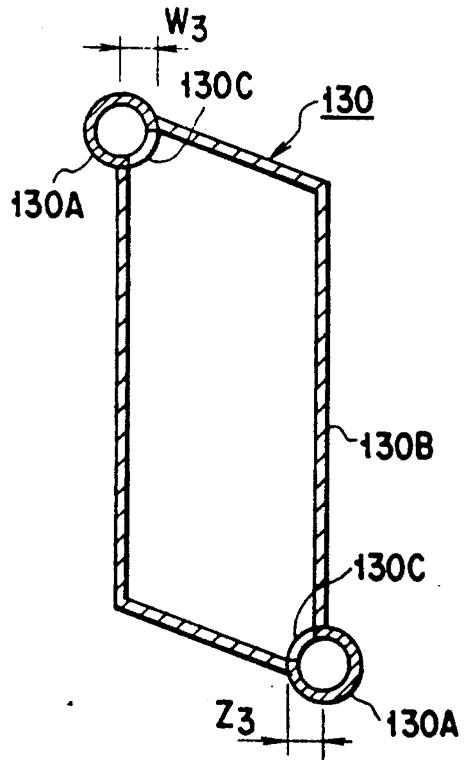
FIG. 31 is a cross-sectional view taken along lie XXXI—XXXI in FIG. 30.

An eighth embodiment of the invention will now be described with reference to FIGS. 30 and 31. A radiator 130 according to the eighth embodiment shown in FIG. 30 is connected to a transformer body of a self-cooling type gas-insulated transformer (not shown). The radiator 130 comprises an upper cylindrical header 130A and a lower cylindrical header 130A, and a plurality of mutually distanced panels 130B which have substantially the same thickness and are arranged along the longitudinal axes of the headers 130A.

Each panel 130B has a shape of a parallelogrammatic shape with two parallel long sides and two parallel short sides. The long sides of each panel 130B are vertically situated. Each header 130A is not situated at a transverse middle part of the panel 130B. The headers 130A are situated at acute-angled corners of the panel 130B, with parts of the headers 130A exposed.

Each of the upper and lower headers 130A has a plurality of ducts 130C along the longitudinal axis thereof.

According to the structure of the eighth embodiment, as in the seventh embodiment, even if the size of the inlet/outlet header 130A is increased, the convection of the air around the panel 130B is hardly prevented by the headers 130A. Thus, the air side heat transfer performance and the insulating gas circulation flow rate can be increased, and the radiation performance per panel can be enhanced remarkably. Furthermore, since the number of headers is smaller than in the sixth embodiment, the welding step and the step of attaching one end portion of the header to the transformer body can be omitted, resulting in a decrease in cost.

In the above embodiment, the cross-sectional shape of the header may be circular, semi-circular, oval, rectangular, polygonal, etc. The lengths W3 and Z3 of the regions where the inlet/outlet headers 130A prevent flow of air around the panel 130B can be freely chosen.

Figure 32:
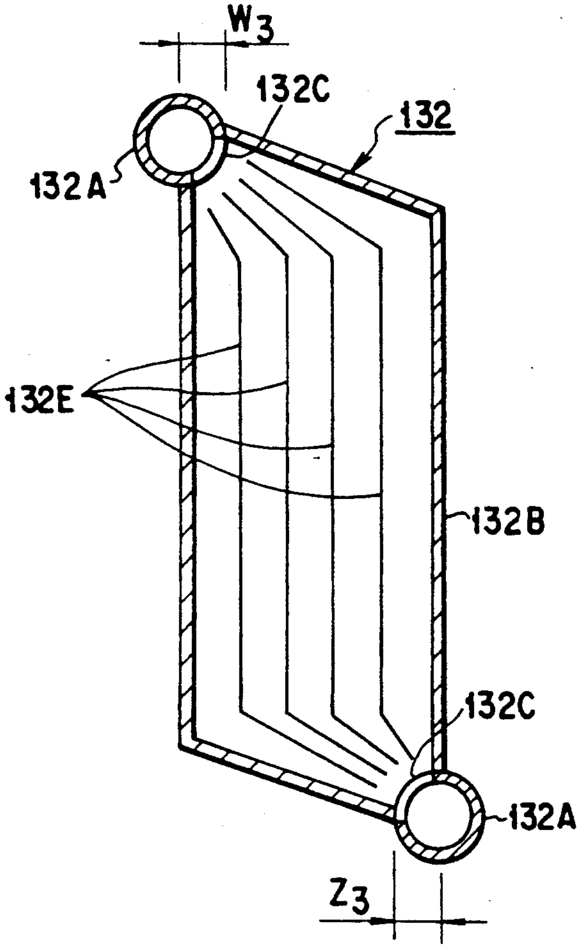
FIG. 32 is a front view of a radiator, which is a main component of a self-cooling type gas-insulated transformer according to a ninth embodiment of the invention.

A ninth embodiment of the invention will now be described with reference to FIG. 32. A radiator 132 according to the ninth embodiment shown in FIG. 32 differs from the radiator of the eighth embodiment with respect to only panels 132B. In the ninth embodiment, if the panel 132B is rectangular, $SF_6$ gas does not flow smoothly at the obtuse-angled corner portions of the panel 132B where inlet and outlet headers 132A are not connected. Thus, the panel 132B is formed as a parallelogram, and, as shown in FIG. 32, guides 132E are provided in passageways in the panel 132B. The guides 132C smooth the flow in the passageways in the panels 132B. Thereby, the panel 132B may be rectangular, square, etc., and the inlet and outlet headers 132A may be connected at the corners on the same vertical side of the panel 132B.

Figure 33:
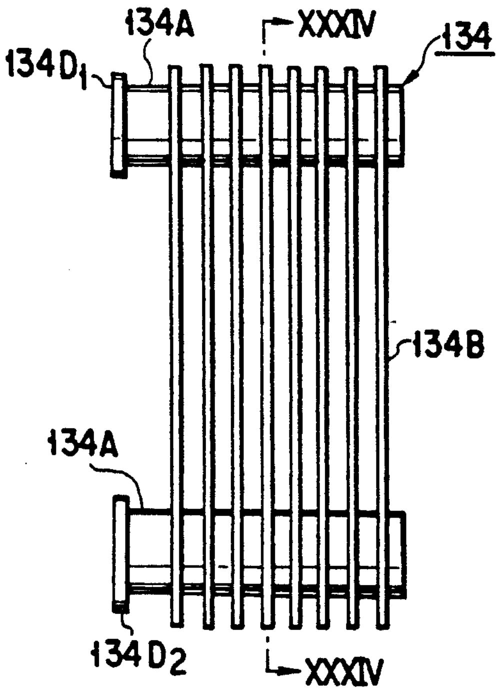
FIG. 33 is a front view of a radiator, which is a main component of a self-cooling type gas-insulated transformer according to a tenth embodiment of the invention.
Figure 34:
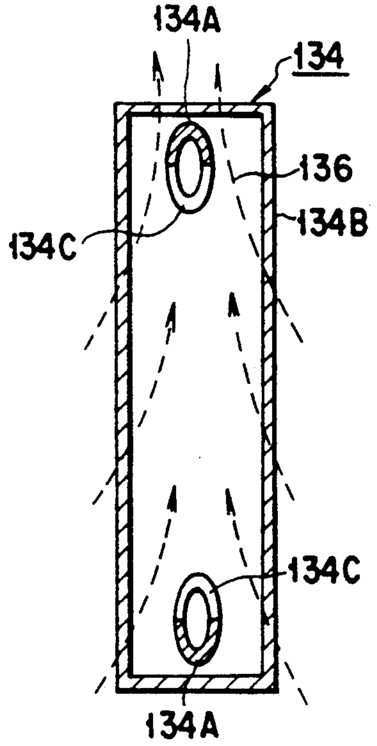
FIG. 34 is a cross-sectional view taken along line XXXIV—XXXIV in FIG. 33.

A tenth embodiment of the present invention will now be described with reference to FIGS. 33 and 34. A radiator 134 according to the tenth embodiment shown in FIG. 33 is connected to a transformer body of a self-cooling type gas-insulated transformer (not shown). The radiator 134 comprises an upper header 134A with an oval cross section area, a lower header 134A with an oval cross section area, and a plurality of mutually distanced panels 134B which have substantially the same thickness and are arranged along the longitudinal axes of the headers 134A. The longer axis in the oval cross section area of the header 134A coincides with the longitudinal axis of the panel 134B. The headers 134A are situated within the panel 134B. Each header 134A is situated at a transverse middle part of the panel 134B.

Each of the upper and lower headers 134A has a plurality of ducts 134C along the longitudinal axis thereof.

According to the structure of the tenth embodiment, each of the inlet and outlet headers 134A is connected at an almost middle part of the panel 134B, as in the prior art. Even if each of the inlet and outlet headers 134A is connected at an almost middle part of the panel 134B, the flow of air around the panel 134B is little prevented by virtue of the oval cross section area of each header 134A. As indicated by broken-line arrows 136, the flow is little prevented by the headers 134A, and the cooling performance is enhanced.

In the above embodiments, $SF_6$ gas circulates naturally between the transformer body and the radiator; however, even if the radiator of this invention is mounted on a transformer of the type wherein $SF_6$ gas is forcibly circulated, smooth convection of air can be caused around the panel and the size and cost of the transformer can be reduced.

In the above embodiments, the radiator is mounted directly on the transformer body; however, the radiator may be connected to the transformer body via pipes, etc.

Next, various modifications of the fifth to tenth embodiments of the invention will now be described with reference FIG. 35, wherein the cross section areas of passageways of the headers are unchanged/varied, the cross section areas of passageways of the panels are identical/different, and the intervals between panels are identical/different.

Type M is a radiator constituted by headers 138A' having varied passageway cross section areas, and panels 138B having an identical passageway cross section area.

Type N is a radiator constituted by headers 138A' having varied passageway cross section areas, and panels 138 having different passageway cross section areas.

Type O is a radiator constituted by headers 138A' having varied passageway cross section areas, and panels 138B and 138B' having different passageway cross section areas. In addition, the interval H1 between the panels 138B' differs from the interval H2 between the panels 138B.

Type P is a radiator constituted by headers 138A having an unchanged passageway cross section area, and panels 138B having an identical passageway cross section area.

Type Q is a radiator constituted by headers 138A having an unchanged passageway cross section area, and panels 138B and 138' having different passageway cross section areas.

Type R is a radiator constituted by headers 138A having an unchanged passageway cross section area, and panels 138B and 138B' having different passageway cross section areas. In addition, the interval H1 between the panels 138B' differs from the interval H2 between the panels 138B.

Figure 35:
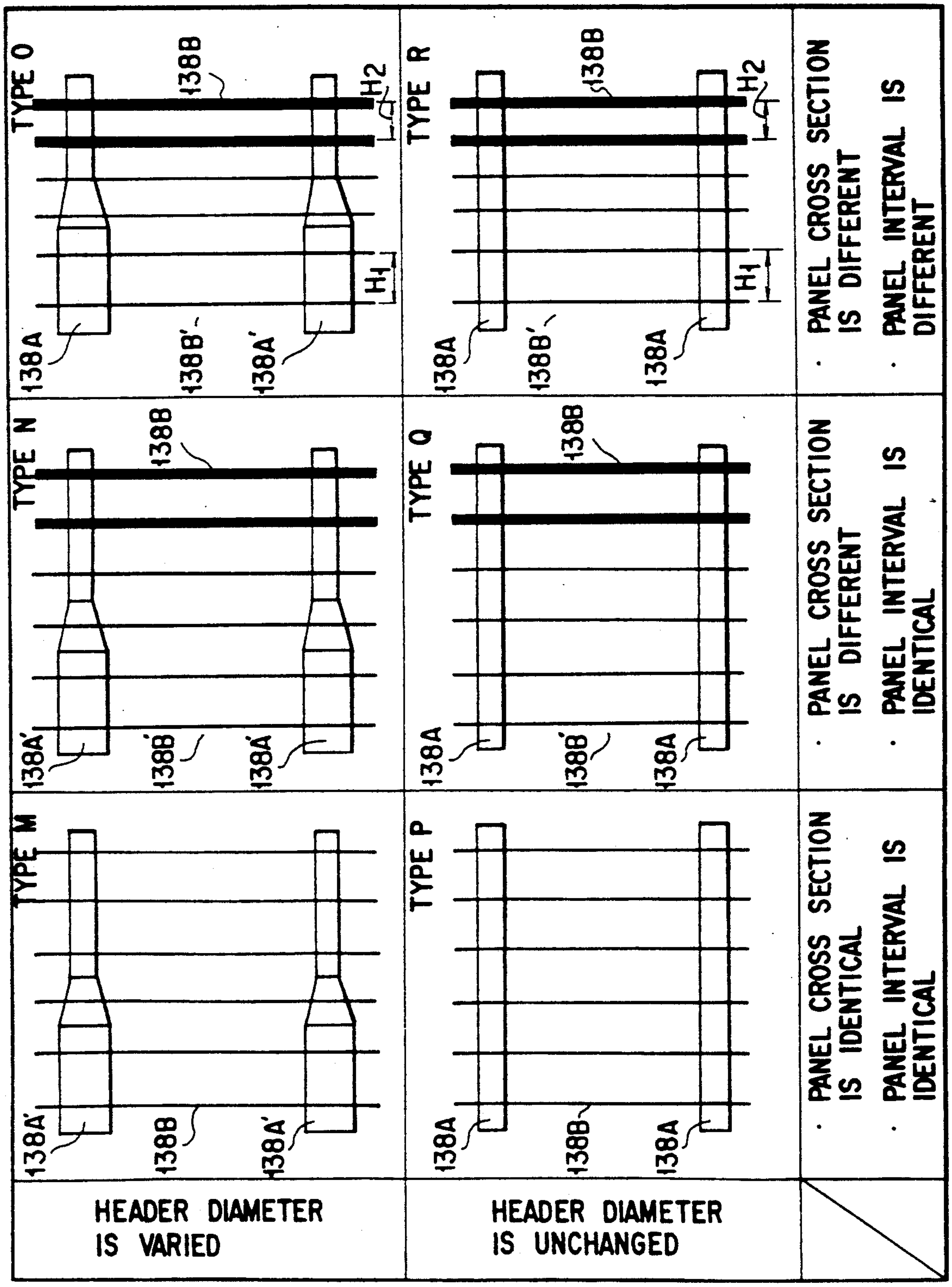
FIG. 35 shows schematically various modifications of the fifth to tenth embodiments of the invention, wherein different diameters of the headers, different cross section areas of the panels and different intervals between panels are employed.

As shown in FIG. 35, various headers and panels of the fifth to tenth embodiments can be employed.

Figure 36:
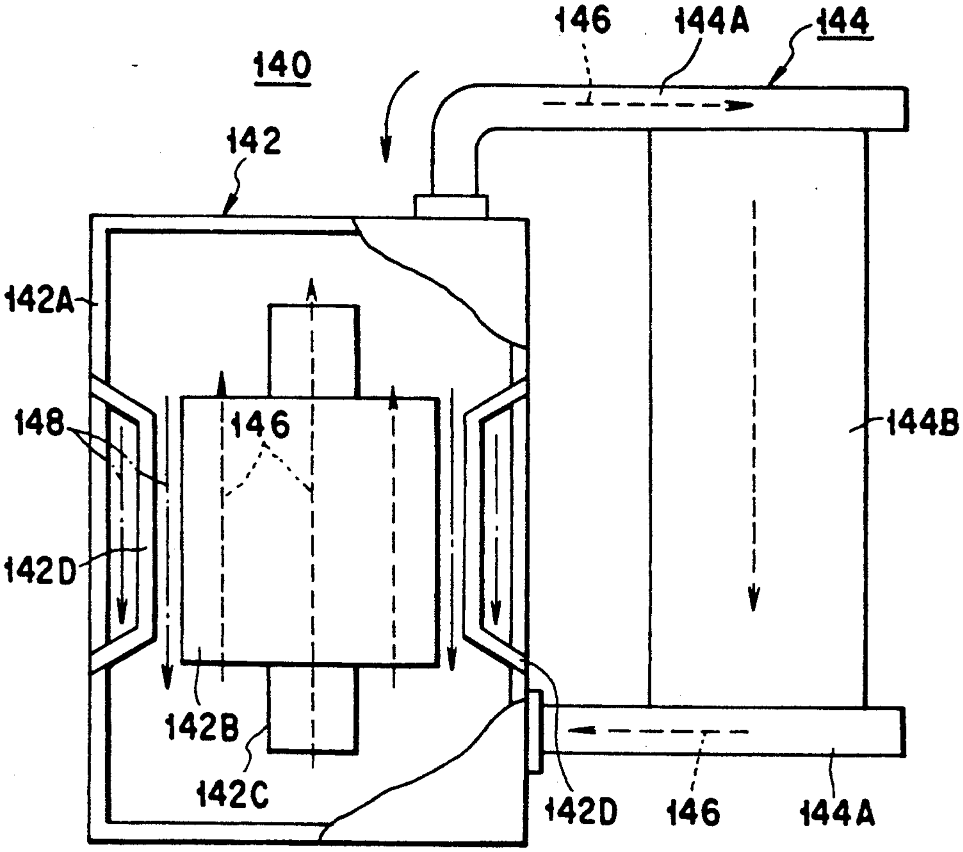
FIG. 36 shows the overall structure of a self-cooling type gas-insulated transformer according to an embodiment of the invention.

The above embodiments are all directed to the radiators. Next, an embodiment of the gas-insulated transformer of the present invention different from that shown in FIG. 7 will now be described with reference to FIG. 36. In FIG. 36, a gas-insulated transformer 140 of the present invention comprises a transformer body 142 and a radiator 144. A coil 142B, an iron core 142C and cooling headers 142D are housed within a casing 142A of the transformer body 142 in the insulated state. The cooling headers 142D are arranged on the inner wall of the casing 142A. The radiator 144 comprises headers 144A and panels 144B.

$SF_6$ gas 16 is filled in the transformer body 142 and radiator 144. The $SF_6$ gas 16 is employed as an insulating gas for maintaining the insulation property of the transformer 140 and as a cooling medium. The gas 16 circulates naturally in the inner spaces of the transformer body 142 and radiator 144, as indicated by broken-line arrows 146 and dot-and-dash-line arrows 148. Specifically, $SF_6$ gas 16 heated while removing heat generated by the coil 142B and iron core 142C in the transformer body 142 is branched into first and second flows at the upper part of the transformer body 142. The first flow enters the radiator 144, advancing downwards while being cooled in the radiator 144, and returns to the inside of the transformer body 142. The second flow falls downwards through the space between the coil 142B and casing 142A, while being cooled by the cooling headers 142D, and become confluent at the lower part of the transformer body 142.

In this embodiment, the cooling headers 144D are provided between the casing 142A of the transformer body 142 and the coil 142B. Thus, the $SF_6$ gas does not rise but falls between the casing 142A and the coil 412B, and the cooling medium passageway cross section area of the radiator and the passageway cross section areas of the coil 142B and iron core 142C can be reduced. Thereby, the transformer can be installed in a limited space, and the size and cost of the transformer can be reduced.

Although the cooling headers 142D are used in this embodiment to cool the $SF_6$ gas in the space between the casing 142A and the coil 142B, the cooling headers 142D may be replaced by other cooling means if the means can cool the $SF_6$ gas in the space between the casing 142A and the coil 142B. Alternatively, the casing 142A is provided with fins or the like to cool the $SF_6$ gas in the space between the casing 142A and the coil 142B. The cooling headers 142D may be provided on the entire or partial inner wall of the casing 142A.

In the above embodiments, a plurality of panels are provided between the inlet header(s) and outlet header(s); however, the number of panels may be at least one.

Figure 37:
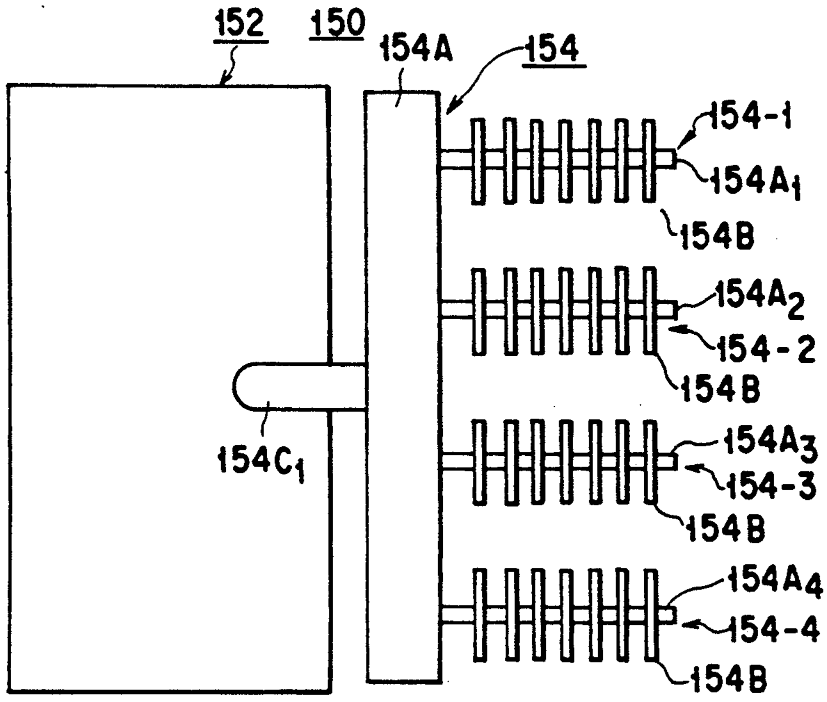
FIG. 37 shows the overall structure of a self-cooling type gas-insulated transformer according to another embodiment of the invention.
Figure 38:
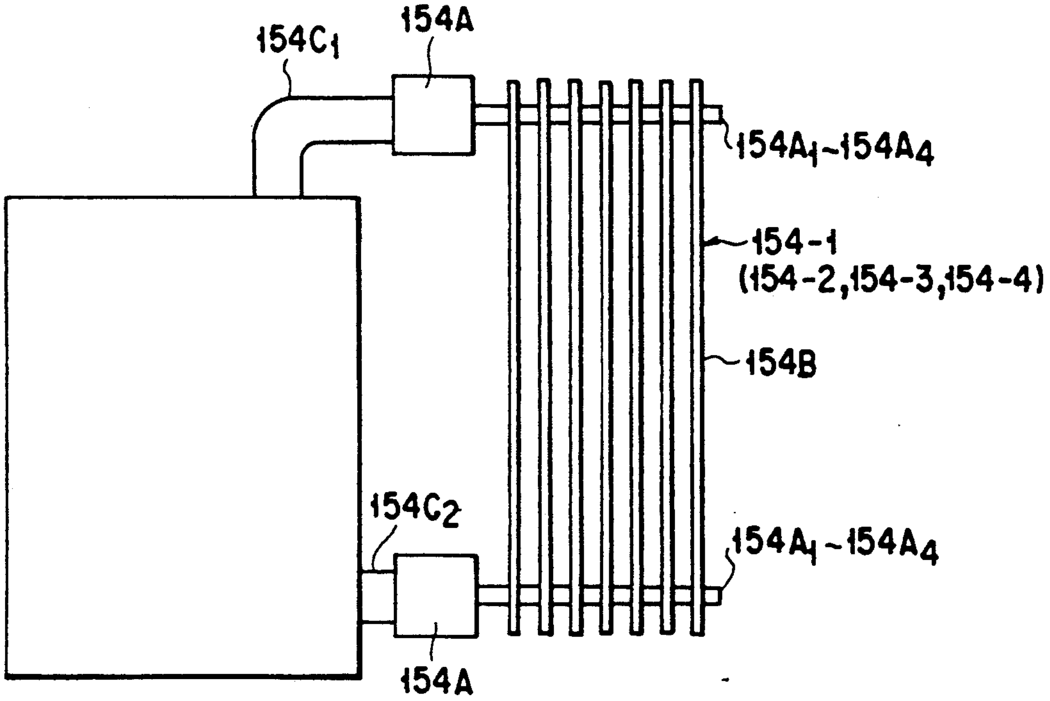
FIG. 38 is a plan view of the transformer shown in FIG. 37.

Another embodiment of the gas-insulated transformer according to the present invention will now be described with reference to FIGS. 37 and 38. A gas-insulated transformer 154 of this embodiment comprises a transformer body 152 and a radiator 154. The radiator 154 comprises an upper manifold 154A, a lower manifold 154A, and four cooling units 154-1, 154-2, 154-3 and 154-4. The four cooling units 154-1 to 154-4 are connected to the upper and lower manifolds 154A. The four cooling units 154-1 to 154-4 have the same construction. The cooling unit 154-1 comprises an upper cylindrical header 154A1, a lower cylindrical header 154A1, and a plurality of mutually distanced panels 154B which have the same structure and are arranged along the longitudinal axes of the headers 154A1. The other cooling units 154-2, 154-3 and 154-4 have the same structure as the cooling unit 154-1.

The number of radiators and the number of panels employed in the present invention can be freely chosen in accordance with the capacity of the transformer.

In the above embodiments, the cooling medium or $SF_6$ gas flows downwards in the direction of gravity; however, the cooling medium may be caused to flow upwards by using a blower. Of course, the $SF_6$ gas may be caused to flow horizontally; in this case, the panels are arranged horizontally.

In the above embodiments, $SF_6$ gas is used as a cooling medium; needless to say, the same effect can be obtained even if the $SF_6$ gas is replaced by other insulating gas or insulating oil.

Figure 39:
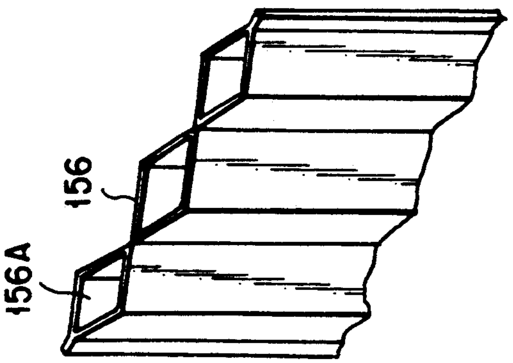
FIGS. 39 to 41 are perspective views showing different panels schematically.
Figure 40:
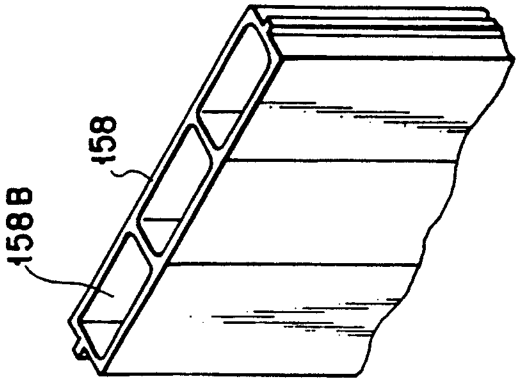
Figure 41:
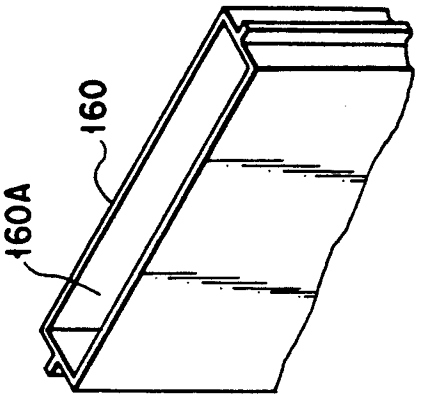

Furthermore, the panel may be replaced by a panel 156 shown in FIG. 39, which has a plurality of rhomboid portions 156A, a panel 158 shown in FIG. 40, which has a plurality of rectangular portions 158A, or a panel 160 shown in FIG. 41, which has a single rectangular portion 160A.

In particular, in the case of the panel 156 having a plurality of rhomboid portions 156A as shown in FIG. 39, air in the rhomboid recesses tends to flow vertically and the difference between the average temperature of $SF_6$ in the panels and the average temperature of air between panels. More specifically, since the temperature of air near panels 156 rises, the fifth embodiment becomes particularly effective.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A gas-insulated electric apparatus comprising:

an electric apparatus body including a storing space, an electric element to be insulated, the electric element housed in the storing space, and a high withstand voltage insulating gas filled in the storing space; and a radiator for cooling the high withstand voltage insulating gas, including at least one gas introducing header connected to the electric apparatus body, for introducing the high withstand voltage insulating gas from the electric apparatus body, at least one gas discharging header connected to the electric apparatus body, for discharging the high withstand voltage insulating gas to the electric apparatus body, at least one gas radiation member having a panel shape, having one open end portion directly or indirectly connected to the at least one gas introducing header, having the other open end portion directly or indirectly connected to the at least one gas discharging header, and having a gas passageway having a plurality of passageways formed along a longitudinal axis of the at least one gas radiation member, and separated from each other along the transverse axis of the gas radiation member, the at least one gas radiation member receiving the high withstand voltage insulating gas from the at least one gas introducing header, cooling the received high withstand voltage insulating gas by radiation, and discharging the cooled high withstand voltage insulating gas to the at least one gas discharging header, and at least one coupler interposed in at least one of a first connection portion between one end portion of the at least one gas radiation member and the at least one gas introducing header and at least another coupler interposed in at least one of a second connecting portion between the other end portion of the at least one gas radiation member and the at least one gas discharging header, said one and other couplers passing the high withstand voltage insulating gas through, said one and other couplers having a passageway with a shape of cross section area gradually varying from said one and other portions of the at least one gas radiation member towards the at least one of the first and second connecting portion, each passageway with a thickness gradually increasing from said one and other end portions of the at least one gas radiation member towards the at least one of the first and second connecting portion.

2. The gas-insulated electric apparatus according to claim 1, wherein said at least one coupler is a rectangle, a rhombus, an ellipse, and/or a shape between said rectangle, said rhombus and said ellipse, and the value obtained by dividing the cross section area of the at least one coupler by the longer side of the duct is 16 mm to 45 mm.

3. The gas-insulated electric apparatus according to claim 1, wherein each passageway of the at least one coupler has inclined portions on the side close to the electric apparatus body and the side away from the electric apparatus body, whereby each passageway cross section area increases gradually from the end portion of the at least one gas radiation member towards at least one of the first and second connecting portion.

4. The gas-insulated electric apparatus according to claim 1, wherein each passageway of the at least one coupler has an inclined portion only on the side close to the electric apparatus body, whereby each passageway cross section area increases gradually from the end portion of the at least one gas radiation member towards at least one of the first and second connection portion.

5. The gas-insulated electric apparatus according to claim 1, wherein each passageway cross section area of the at least one gas introducing header varies along the longitudinal axis thereof.

6. The gas-insulated electric apparatus according to claim 1, wherein each passageway cross section area of the at least one gas discharging header varies along the longitudinal axis thereof.

7. The gas-insulated electric apparatus according to claim 1, wherein said at least one gas radiation member comprises a plurality of gas radiation members with different passageway cross section areas.

8. The gas-insulated electric apparatus according to claim 1, wherein said at least one gas radiation member comprises a plurality of gas radiation members and the distance between the plurality of gas radiation members is not constant.

9. The gas-insulated electric apparatus according to claim 1, wherein the plurality of passageways of the at least one gas radiation member comprise a plurality of rhomboid portions and/or a plurality of rectangular portions in its cross section area.

10. The gas-insulated electric apparatus according to claim 1, wherein said electric apparatus body has, in the storage space, cooling means for cooling the high withstand voltage insulating gas.

11. The gas-insulated electric apparatus comprising:

an electric apparatus body including a storing space, an electric element to be insulated, the electric element housed in the storing space, and a high withstand voltage insulating gas filled in the storing space; and a radiator for cooling the high withstand voltage insulating gas, including at least one gas introducing header connected to the electric apparatus body, for introducing the high withstand voltage insulating gas from the electric apparatus body, the at least one gas introducing having a plurality of ducts arranged along the longitudinal axis of the at least one gas introducing header, at least one gas discharging header connected to the electric apparatus body, for discharging the high withstand voltage insulating gas to the electric apparatus body, the t least one gas discharging header having a plurality of ducts arranged along the longitudinal axis of the at least one gas discharging header, at least one gas radiation member having a panel shape, having one open end portion directly or indirectly connected to the at least one gas introducing header, having the other open end portion directly or indirectly connected to the at least one gas discharging header, and having a gas passageway having a predetermined passageway cross section area along the longitudinal axis of the at least one gas radiation member, the at least one gas radiation member receiving the high withstand voltage insulating gas from the at least one gas introducing header, cooling the received high withstand voltage insulating gas by radiation, and discharging the cooled high withstand voltage insulating gas to the at least one gas discharging header, and varying means arranged in at least one of the at least one gas introducing header and the at least one gas discharging header, for varying the passageway cross section area in at least one of the at least one gas introducing header and the at least one gas discharging header, so as to make the flow rate at the passageway along the transverse axis of the at least one gas radiation member uniform.

12. In a gas-insulated electric apparatus comprising:

an electric apparatus body including a storing space, an electric element to be insulated, the electric element housed in the storing space, and a high withstand voltage insulating gas filled in the storing space; and a radiator for cooling the high withstand voltage insulating gas, including at least one gas radiation member having a panel shape, having a gas passageway having a predetermined passageway cross section area along the longitudinal axis of the at least one gas radiation member, at least one gas introducing header connected to the electric apparatus body, for introducing the high withstand voltage insulating gas from the electric apparatus body, the at least one gas introducing header having a predetermined passageway cross section area, being inserted in the vicinity of one longitudinal end portion of the at least one gas radiation member, and having a duct at a portion crossing the at least one gas radiation member, at least one gas discharging header connected to the electric apparatus body, for discharging the high withstand voltage insulating gas to the electric apparatus body, the at least one gas discharging header having a predetermined passageway cross section area, being inserted in the vicinity of the other longitudinal end portion of the at least one gas radiation member, and having a duct at a portion crossing the at least one gas radiation member, the improvement wherein at least one of the transverse dimension of the at least one gas introducing header and the transverse dimension of the at least one gas discharging header is equal to or lower than the value obtained by multiplying the transverse dimension of the at least one gas radiation member by 0.36, and the passageway cross section area in at least one of the at least one gas introducing header and the at least one gas discharged header is equal to or greater than the area of a circle having a diameter equal to a value obtained by multiplying the transverse dimension of the at least one gas radiation member by 0.25.

13. The gas-insulated electric apparatus according to claim 12, wherein said electric apparatus body has, in the storage space, cooling means for cooling the high withstand voltage insulating gas.

14. The gas-insulated electric apparatus according to claim 12, wherein said at least one gas radiation member comprises a plurality of gas radiation members with different passageway cross section areas.

15. The gas-insulated electric apparatus according to claim 12, wherein said at least one gas radiation member comprises a plurality of gas radiation members with different passageway cross section areas, and the distance between the plurality of gas radiation members is not constant.

16. The gas-insulated electric apparatus according to claim 12, wherein the at least one gas radiation member includes a plurality of rhomboid portions in its cross section area.

17. In a gas-insulated electric apparatus comprising an electric apparatus body including a storing space, an electric element to be insulated, the electric element housed in the storing space, and a high withstand voltage insulating gas filled in the storing space; and a radiator for cooling the high withstand voltage insulating gas, including at least one gas radiation member having a panel shape, having a gas passageway having a predetermined passageway cross section area along the longitudinal axis of the at least one gas radiation member, at least one gas introducing header for introducing the high withstand voltage insulating gas from the electric apparatus body, the at least one gas introducing header having a predetermined passageway cross section area, being inserted in the vicinity of one longitudinal end portion of the at least one gas radiation member, and having a duct at a portion crossing the at least one gas radiation member, at least one gas discharging header for discharging the high withstand voltage insulating gas to the electric apparatus body, the at least one gas discharging header having a predetermined passageway cross section area, being inserted in the vicinity of the other longitudinal end portion of the at least one gas radiation member, and having a duct at a portion crossing the at least one gas radiation member, the improvement wherein at least one of the at least one gas introducing header and the at least one gas discharging header is situated near a transverse end portion of the at least one gas radiation member.

18. The gas-insulated electric apparatus according to claim 17, wherein that part of at least one of the at least one gas introducing header and the at least one gas discharging header is exposed from the at least one gas radiation member.

19. The gas-insulated electric apparatus according to claim 17, wherein said electric apparatus body has, in the storage space, cooling means for cooling the high withstand voltage insulating gas.

20. In a gas-insulated electric apparatus comprising:

an electric apparatus body including a storing space, an electric element to be insulated, the electric element housed in the storing space, and a high withstand voltage insulating gas filled in the storing space; and a radiator for cooling the high voltage withstand voltage insulating gas, including at least one gas radiation member having a panel shape, having a gas passageway having a predetermined passageway cross section area along the longitudinal axis of the at least one gas radiation member, at least one gas introducing header for introducing the high withstand voltage insulating gas from the electric apparatus body, the at least one gas introducing header having a predetermined passageway cross section area, being inserted in the vicinity of one longitudinal end portion of the at least one gas radiation member, and having a duct at a portion crossing the at least one gas radiation member, at least one gas discharging header for discharging the high withstand voltage insulating gas to the electric apparatus body, the at least one gas discharging header having a predetermined passageway cross section area, being inserted in the vicinity of one longitudinal end portion of the at least one gas radiation member, and having a duct at a portion crossing the at least one gas radiation member, the improvement wherein at least one of the at least one gas introducing header and the at least one gas discharging header has such a cross-sectional shape as to reduce the passage resistance to air rising on the outside of the at least one gas radiation member.

21. The gas-insulated electric apparatus according to claim 20, wherein part of at least one of the at least one gas introducing header and the at least one gas discharging header is exposed from the at least one gas radiation member.

22. The gas-insulated electric apparatus according to claim 20, wherein said electric apparatus body has, in the storage space, cooling means for cooling the high withstand voltage insulating gas.

* * * * *